(12) United States Patent
Yagi et al.

(10) Patent No.: US 10,725,352 B2
(45) Date of Patent: Jul. 28, 2020

(54) ACTIVE MATRIX SUBSTRATE AND DISPLAY DEVICE USING SAME

(71) Applicant: Sharp Kabushiki Kaisha, Sakai, Osaka (JP)

(72) Inventors: Toshifumi Yagi, Sakai (JP); Meng-Yi Hung, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/480,686

(22) PCT Filed: Jan. 23, 2018

(86) PCT No.: PCT/JP2018/001983
§ 371 (c)(1),
(2) Date: Jul. 25, 2019

(87) PCT Pub. No.: WO2018/139450
PCT Pub. Date: Aug. 2, 2018

(65) Prior Publication Data
US 2019/0391428 A1   Dec. 26, 2019

(30) Foreign Application Priority Data

Jan. 27, 2017   (JP) .................................. 2017-012838

(51) Int. Cl.
*G02F 1/1345*      (2006.01)
*G02F 1/1368*      (2006.01)
(Continued)

(52) U.S. Cl.
CPC ........ *G02F 1/13454* (2013.01); *G02F 1/1368* (2013.01); *H01L 27/1225* (2013.01);
(Continued)

(58) Field of Classification Search
CPC ............. G02F 1/1368; G02F 2201/121; G02F 2201/123; G02F 1/136213;
(Continued)

(56) References Cited

U.S. PATENT DOCUMENTS

2009/0323005 A1   12/2009  Ota
2012/0138922 A1    6/2012  Yamazaki et al.
(Continued)

FOREIGN PATENT DOCUMENTS

CN      104733478 A    6/2015
JP      2000-267128 A  9/2000
(Continued)

OTHER PUBLICATIONS

Official Communication issued in International Patent Application No. PCT/JP2018/001983, dated Mar. 27, 2018.

*Primary Examiner* — Jia X Pan
(74) *Attorney, Agent, or Firm* — Keating & Bennett, LLP

(57) ABSTRACT

An active matrix substrate includes a peripheral circuit including a first TFT disposed in a non-display region and a capacitance portion, and a lower transparent electrode and an upper transparent electrode disposed in each pixel. The active matrix substrate includes a gate metal layer including a gate electrode of the first TFT, a source metal layer including a source electrode of the first TFT, a lower transparent conductive layer positioned above the gate metal layer and the source metal layer and including the lower transparent electrode, and an upper transparent conductive layer including the upper transparent electrode. The capacitance portion includes a first capacitor including a first lower capacitance electrode formed in the lower transparent conductive layer, a first upper capacitance electrode formed in
(Continued)

the upper transparent conductive layer, and a portion positioned between these capacitance electrodes in a dielectric layer.

19 Claims, 14 Drawing Sheets

(51) Int. Cl.
*H01L 27/12* (2006.01)
*G02F 1/1343* (2006.01)
(52) U.S. Cl.
CPC ............... *H01L 27/1255* (2013.01); *G02F 2001/134372* (2013.01); *G02F 2201/121* (2013.01); *G02F 2201/123* (2013.01)
(58) Field of Classification Search
CPC ..... G02F 2001/134372; G02F 1/13454; G02F 1/13452; H01L 27/1255; H01L 29/7869
See application file for complete search history.

(56) References Cited

U.S. PATENT DOCUMENTS

| | | |
|---|---|---|
| 2013/0320334 A1 | 12/2013 | Yamazaki et al. |
| 2014/0152613 A1 | 6/2014 | Ishizaki et al. |
| 2014/0286076 A1 | 9/2014 | Aoki et al. |
| 2015/0070616 A1* | 3/2015 | Ogasawara ........... G02F 1/1368 349/43 |
| 2015/0108467 A1 | 4/2015 | Moriguchi et al. |
| 2015/0138466 A1* | 5/2015 | Mori ..................... G11C 19/28 349/38 |
| 2016/0372497 A1* | 12/2016 | Lee ................... G02F 1/136213 |
| 2017/0038651 A1 | 2/2017 | Takamaru et al. |
| 2018/0120656 A1 | 5/2018 | Okada et al. |

FOREIGN PATENT DOCUMENTS

| | | |
|---|---|---|
| JP | 2008-32899 A | 2/2008 |
| JP | 2010-8758 A | 1/2010 |
| JP | 2012-134475 A | 7/2012 |
| JP | 2014-7399 A | 1/2014 |
| JP | 2014-109904 A | 6/2014 |
| JP | 2014-209727 A | 11/2014 |
| JP | 2016-167093 A | 9/2016 |
| WO | 2012/086513 A1 | 6/2012 |
| WO | 2015/159800 A1 | 10/2015 |
| WO | 2017/002724 A1 | 1/2017 |

* cited by examiner

ACTIVE MATRIX SUBSTRATE AND DISPLAY DEVICE USING SAME

TECHNICAL FIELD

The disclosure relates to an active matrix substrate and a display device using the same.

BACKGROUND ART

An active matrix substrate used in a liquid crystal display device and the like includes a display region including a plurality of pixels, and a region other than the display region (a non-display region or a frame region). The display region includes a switching element such as a Thin Film Transistor (hereinafter referred to as a "TFT") for each of the pixels. As such a switching element, a TFT including an amorphous silicon film serving as an active layer (hereinafter referred to as an "amorphous silicon TFT") and a TFT including a polycrystalline silicon film serving as an active layer (hereinafter referred to as a "polycrystalline silicon TFT") have been widely used in the related art.

The use of an oxide semiconductor as a material of the active layer of the TFT, in place of amorphous silicon and polycrystalline silicon has been proposed. Such a TFT is referred to as an "oxide semiconductor TFT." The oxide semiconductor has mobility higher than mobility of amorphous silicon. Thus, the oxide semiconductor TFT can act at a higher speed than the amorphous silicon TFT.

In the non-display region of the active matrix substrate, a drive circuit such as a gate driver and a source driver may be provided in a monolithic manner (integrally). The drive circuit formed in a monolithic manner is called a "monolithic driver." The monolithic driver is typically constituted by using a TFT. In recent years, a technique of preparing the monolithic driver by using the oxide semiconductor TFT has been used. Accordingly, cost reduction by narrowing of the non-display region and simplifying of a mounting process is achieved. In a device highly demanding narrowing of a frame, a gate driver circuit may be formed in a monolithic manner in the non-display region, and a source driver circuit may be mounted in the non-display region by a Chip On Glass (COG) method, for example.

A liquid crystal display device of an active matrix type is manufactured by providing a counter substrate to face the active matrix substrate described above, and enclosing a liquid crystal material in a space between these substrates, for example. The liquid crystal material is enclosed with a sealing member. The sealing member is disposed to surround a display region.

For example, PTL 1 discloses a liquid crystal display device of an active matrix type including a monolithic gate driver. In the display device disclosed in PTL 1, an output transistor constituting the gate driver is disposed closer to a display region than a sealing member, and another TFT and a capacitor constituting the gate driver are disposed to overlap with a region where the sealing member is applied. In PTL 1, an opening or a cut-out portion provided in a capacitor connected to a gate of the output transistor (a bootstrap capacitance portion) to facilitate an inspection step of the sealing member or to irradiate the sealing member with light when the sealing member being photocurable is used, has been proposed.

CITATION LIST

Patent Literature

PTL 1: JP 2016-167093 A

SUMMARY

Technical Problem

In recent years, a display panel including a drive circuit provided in a monolithic manner demands further narrowing of a non-display region (frame region). Thus, there is a demand for further reduction in circuit area or a circuit width of the drive circuit (monolithic driver).

However, according to the study by the present inventors, for example, in a monolithic gate driver of the related art, an output transistor and a bootstrap capacitance portion are large in size, and thus, it is difficult to further narrow circuit area. In addition, when an active matrix substrate is applied to a liquid crystal display device, it is necessary to provide a transparent portion (such as an opening) in a bootstrap capacitance portion to cure a sealing member or perform inspection, and there is a problem of further increase in circuit area.

Embodiments of the disclosure are made in light of the circumstances described above, and an object of the disclosure is to provide an active matrix substrate and a display device capable of reduction in circuit area or a circuit width of a monolithic driver.

Solution to Problem

An active matrix substrate of an embodiment of the disclosure is an active matrix substrate including a display region including a plurality of pixels, and a non-display region provided in a periphery of the display region, a substrate, a peripheral circuit supported by the substrate, disposed in the non-display region, and including a first TFT and a capacitance portion, a lower transparent electrode disposed in each of the plurality of pixels, and an upper transparent electrode disposed on the lower transparent electrode via a dielectric layer in the display region, wherein the active matrix substrate includes a gate metal layer including a gate electrode of the first TFT, a source metal layer including a source electrode of the first TFT, a lower transparent conductive layer positioned above the gate metal layer and the source metal layer and including the lower transparent electrode, and an upper transparent conductive layer positioned above the lower transparent conductive layer and including the upper transparent electrode, and the capacitance portion includes a first capacitor including a first lower capacitance electrode formed in the lower transparent conductive layer, a first upper capacitance electrode formed in the upper transparent conductive layer, and a portion positioned between the first lower capacitance electrode and the first upper capacitance electrode in the dielectric layer.

In an embodiment, one of the lower transparent electrode and the upper transparent electrode is a pixel electrode, and the other is a common electrode.

In an embodiment, the capacitance portion further includes a second capacitor connected in parallel to the first capacitor and disposed on the substrate side of the first capacitor, and the second capacitor includes a second lower capacitance electrode, and a second upper capacitance electrode disposed on the second lower capacitance electrode via an insulator, and one of the second lower capacitance electrode and the second upper capacitance electrode is formed in the gate metal layer, and the other is formed in the source metal layer.

In an embodiment, the first capacitor and the second capacitor at least partially overlap with each other as viewed from a normal direction of the substrate.

In an embodiment, the second lower capacitance electrode and the second upper capacitance electrode each include a cut-out portion and/or an opening, and the cut-out portion and/or the opening of the second lower capacitance electrode and the cut-out portion and/or the opening of the second upper capacitance electrode are disposed to face each other.

In an embodiment, one of the first lower capacitance electrode and the first upper capacitance electrode of the capacitance portion is electrically connected to the gate electrode of the first TFT, and the other is electrically connected to the source electrode of the first TFT.

In an embodiment, the peripheral circuit is a gate driver including a shift register including a plurality of unit circuits, and each of the plurality of unit circuits includes the first TFT and the capacitance portion, the first TFT is an output transistor, and the capacitance portion is a bootstrap capacitance portion.

In an embodiment, the active matrix substrate further includes a second TFT disposed in each of the plurality of pixels, and the second TFT is an oxide semiconductor TFT including an oxide semiconductor layer.

In an embodiment, the oxide semiconductor layer includes an In—Ga—Zn—O based semiconductor.

The In—Ga—Zn—O based semiconductor may include a crystalline portion.

In an embodiment, the second TFT is a channel etched type TFT.

In an embodiment, the second TFT is an etch stop type TFT.

A display device of an embodiment of the disclosure is a display device including the active matrix substrate according to any of the above, a counter substrate disposed to face the active matrix substrate, a liquid crystal layer provided between the active matrix substrate and the counter substrate, and a sealing portion formed of a sealing member including a photocurable resin and surrounding the liquid crystal layer, wherein at least a portion of the first capacitor overlaps with the sealing portion as viewed from a normal direction of the substrate.

A display device of another embodiment of the disclosure is a display device including an active matrix substrate including a display region including a plurality of pixels, and a non-display region provided in a periphery of the display region, a substrate, a peripheral circuit supported by the substrate, disposed in the non-display region, and including a first TFT and a capacitance portion, and a pixel electrode disposed in each of the plurality of pixels in the display region, a counter substrate disposed to face the active matrix substrate, and a liquid crystal layer provided between the active matrix substrate and the counter substrate, wherein the active matrix substrate includes a gate metal layer including a gate electrode of the first TFT, a source metal layer including a source electrode of the first TFT, and a lower transparent conductive layer positioned above the gate metal layer and the source metal layer and including the pixel electrode, the counter substrate includes an upper transparent conductive layer including a common electrode disposed to face the pixel electrode, the capacitance portion includes a first capacitor, and a second capacitor connected in parallel to the first capacitor and disposed on the substrate side of the first capacitor, and the first capacitor and the second capacitor at least partially overlap with each other as viewed from a normal direction of the substrate, the first capacitor includes a first lower capacitance electrode formed in the lower transparent conductive layer, a first upper capacitance electrode formed in the upper transparent conductive layer, and a portion positioned between the first lower capacitance electrode and the first upper capacitance electrode in the liquid crystal layer, and the second capacitor includes a second lower capacitance electrode, and a second upper capacitance electrode disposed on the second lower capacitance electrode via an insulator, and one of the second lower capacitance electrode and the second upper capacitance electrode is formed in the gate metal layer, and the other is formed in the source metal layer.

The display device further includes a sealing portion surrounding the liquid crystal layer, and the sealing portion has electrical conductivity or includes particles having electrical conductivity, the lower transparent conductive layer further includes a transparent connection portion disposed in the non-display region and electrically separated from the first upper capacitance electrode, and the first lower capacitance electrode is electrically connected to the second lower capacitance electrode or the second upper capacitance electrode of the second capacitor via the sealing portion and the transparent connection portion.

The display device further includes a second TFT disposed in each of the plurality of pixels, and the second TFT is an oxide semiconductor TFT including an oxide semiconductor layer.

In an embodiment, the oxide semiconductor layer includes an In—Ga—Zn—O based semiconductor.

The In—Ga—Zn—O based semiconductor may include a crystalline portion.

In an embodiment, the second TFT is a channel etched type TFT.

In an embodiment, the second TFT is an etch stop type TFT.

Advantageous Effects of Disclosure

According to an embodiment of the disclosure, an active matrix substrate and a display device capable of reduction in circuit area or a circuit width of a monolithic driver are provided.

DESCRIPTION OF EMBODIMENTS

First Embodiment

Hereinafter, an active matrix substrate of a first embodiment, and a display device (liquid crystal display panel) using the same will be described with reference to the drawings. The active matrix substrate including a gate driver formed in a monolithic manner will be described below. Note that in the active matrix substrate of the present embodiment, a circuit (peripheral circuit) including a TFT and a capacitance portion may be formed in a monolithic manner in a non-display region. The circuit including the TFT and the capacitance portion may be a circuit other than the gate driver.

Figure 1A:
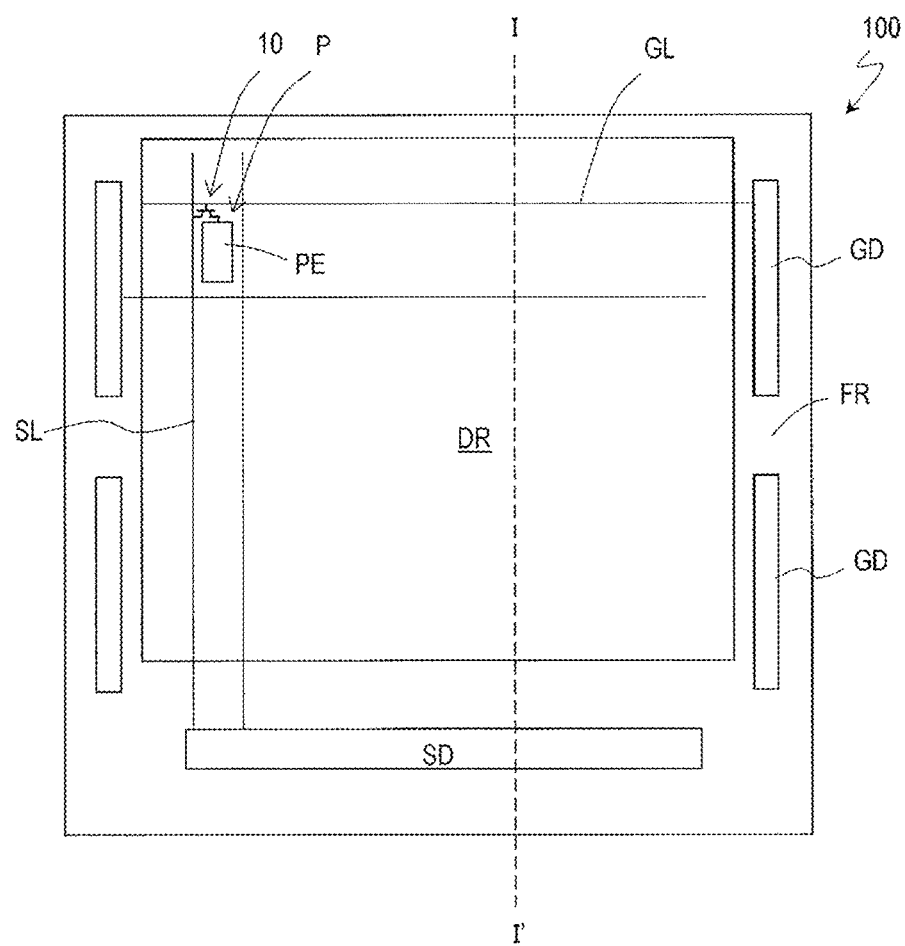
FIG. 1A is a schematic view illustrating an example of a plane structure of an active matrix substrate 100 of the present embodiment.

Structures of Active Matrix Substrate and Active Matrix Type Liquid Crystal Display Panel FIG. 1A is a schematic view illustrating an example of a plane structure of an active matrix substrate 100 of the present embodiment.

The active matrix substrate 100 includes a display region DR, and a region (a non-display region or a frame region) FR other than the display region DR. The display region DR includes a pixel region P where pixels are arranged in a matrix shape. The pixel region P is a region corresponding to a pixel of the display device, and may be called simply the "pixel." The non-display region FR is a region positioned in a periphery of the display region DR and not contributing to display. The non-display region FR includes a terminal portion formation region where a terminal portion is formed, a drive circuit formation region where a drive circuit is integrally (in a monolithic manner) provided, and the like. In the drive circuit formation region, a gate driver GD, an inspection circuit (not illustrated), and the like are provided in a monolithic manner, for example a source driver SD is mounted in the active matrix substrate 100, for example. In the display region DR, a plurality of gate bus lines GL extending in a row direction, and a plurality of source bus lines SL extending in a column direction are formed. Respective pixels are defined by the gate bus lines GL and the source bus lines SL, for example. The gate bus lines GL are each connected to each terminal of the gate driver GD. The source bus lines SL are each connected to each terminal of the source driver SD mounted in the active matrix substrate 100.

Figure 1B:
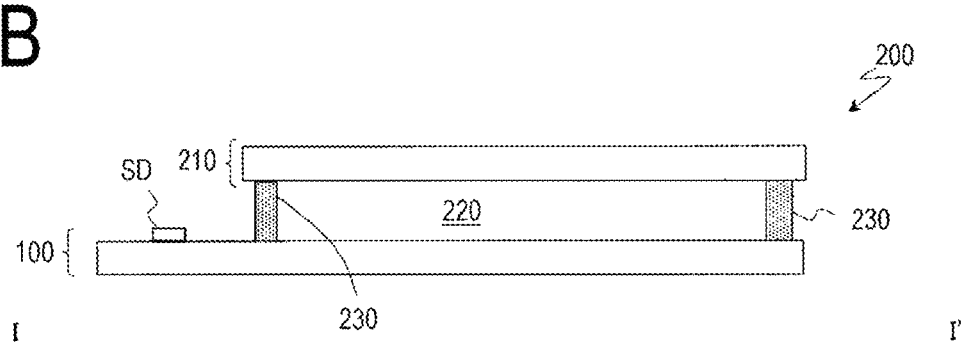
FIG. 1B is a schematic cross-sectional view of a liquid crystal display device using the active matrix substrate 100.

FIG. 1B is a schematic cross-sectional view exemplifying a liquid crystal display device (hereinafter referred to as a "Liquid Crystal Display (LCD) panel") 200 including the active matrix substrate 100. FIG. 1B illustrates a cross-sectional structure taken along line I-I' of the active matrix substrate 100 illustrated in FIG. 1A.

The LCD panel 200 includes the active matrix substrate 100, a counter substrate 210, and a liquid crystal layer 220 provided between these substrates. Although not illustrated, the LCD panel 200 includes a pair of electrodes (a pixel electrode and a counter electrode) configured to apply a voltage to the liquid crystal layer 220. The pixel electrode is disposed for each pixel region P of the active matrix substrate 100. The counter electrode is disposed in the active matrix substrate 100 or the counter substrate 210. The counter electrode is provided in common to a plurality of the pixels constituting the display region DR, and thus is also called a "common electrode." When an action mode of the LCD panel 200 is a vertical electric field mode such as a Twisted Nematic (TN) mode and a Vertical Alignment (VA) mode, the common electrode is provided in the counter substrate 210. When the action mode of the LCD panel 200 is a transverse electric field mode such as a Fringe Field Switching (FFS) mode, the common electrode is provided to face the pixel electrode via an insulating layer (dielectric layer) in the active matrix substrate 100.

A sealing portion 230 seals the display region DR including a liquid crystal material. The sealing portion 230 is disposed to surround the liquid crystal layer 220 as viewed from a normal direction of the LCD panel 200. In addition, the sealing portion 230 bonds and fixes the active matrix substrate 100 and the counter substrate 210 to each other. The sealing portion 230 is formed by using a sealing member including a photocurable resin (for example, an ultraviolet curable resin), for example. Specifically, the sealing member is first applied to one of the active matrix substrate 100 and the counter substrate 210 to surround a region to be the display region, and the liquid crystal material is dropped into the inside of the sealing member. Subsequently, the two substrates are bonded to each other, and a portion surrounded by the sealing member is entirely filled with the liquid crystal material. Then, the sealing member is irradiated with ultraviolet light (UV light) to cure the sealing member. Accordingly, the sealing portion 230 is obtained.

Configuration of Pixel Region P in Active Matrix Substrate 100

Then, a configuration of each pixel region P in the active matrix substrate 100 will be described. Here, an active matrix substrate applied to an LCD panel of an FFS mode will be described as an example.

Figure 2A:
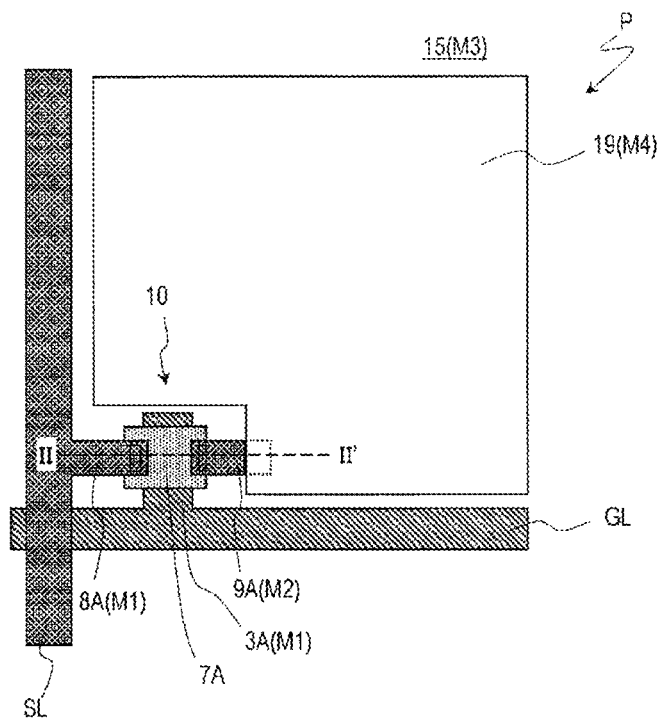
FIGS. 2A and 2B are respectively a plan view of one pixel region P in the active matrix substrate 100 and a cross-sectional view taken along line II-II' of the one pixel region P.
Figure 2B:
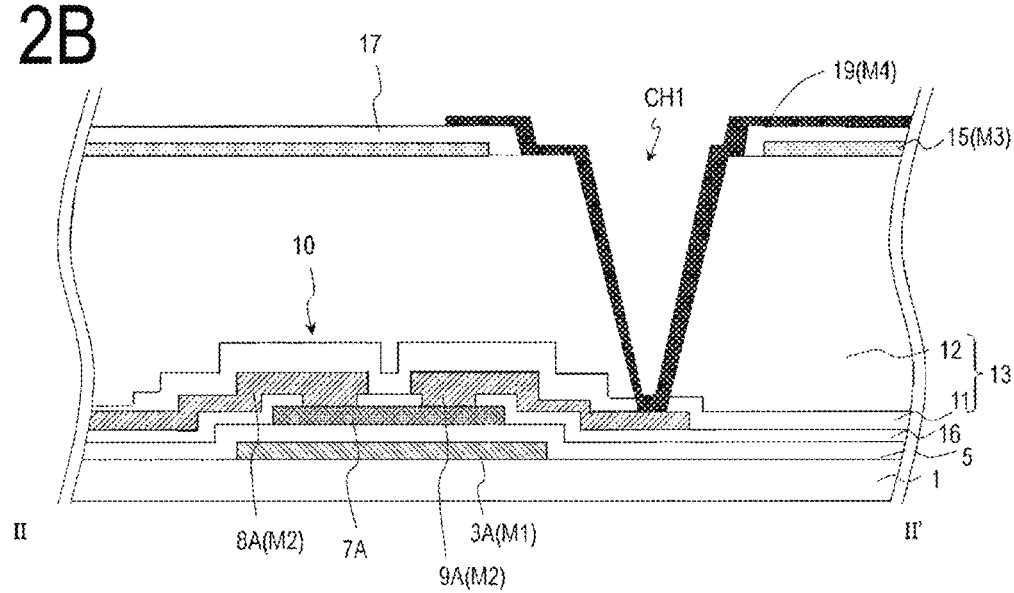

FIGS. 2A and 2B are respectively a plan view of one pixel region P in the active matrix substrate 100 and a cross-sectional view taken along line II-IF of the one pixel region P.

The pixel region P is a region surrounded by the source bus line SL and the gate bus line GL extending in a direction intersecting the source bus line SL. The pixel region P includes a substrate 1, a TFT (hereinafter referred to as a "pixel TFT") 10 supported by the substrate 1, a lower transparent electrode 15, and an upper transparent electrode 19. In this example, the lower transparent electrode 15 is a common electrode CE, and the upper transparent electrode 19 is a pixel electrode PE. The pixel TFT 10 is an oxide semiconductor TFT including a bottom gate structure, for example.

Each layer constituting the active matrix substrate 100 is as follows.

The active matrix substrate 100 includes a lower metal layer M1, an upper metal layer M2, a lower transparent conductive layer M3, and an upper transparent conductive layer M4, from the substrate 1 side. The lower metal layer M1 and the upper metal layer M2 are each typically a layer formed of a metal film. The lower transparent conductive layer M3 and the upper transparent conductive layer M4 are each a layer formed of a transparent conductive film made of an Indium Tin Oxide (ITO), an Indium Zinc Oxide (IZO), or the like, for example.

When the pixel TFT 10 includes a bottom gate structure, the lower metal layer M1 may be a gate metal layer formed of the same conductive film as a conductive film of the gate bus line GL, and the upper metal layer M2 may be a source metal layer formed of the same conductive film as a conductive film of the source bus line SL. When the pixel TFT 10 includes a top gate structure, the lower metal layer M1 may be a source metal layer, and the upper metal layer M2 may be a gate metal layer.

The lower transparent conductive layer M3 is a layer formed of the same transparent conductive film as a transparent conductive film of the lower transparent electrode 15 disposed in the display region DR, and the upper transparent conductive layer M4 is a layer formed of the same transparent conductive film as a transparent conductive film of the upper transparent electrode 19 disposed in the display region DR. One of the lower transparent electrode 15 and the upper transparent electrode 19 may be the common electrode CE, and the other may be the pixel electrode PE. In this case, although not illustrated, the upper transparent electrode 19 includes a slit or a cut-out portion for each pixel.

In the example illustrated, the lower metal layer M1, the gate insulating layer 5, a semiconductor layer including an active layer (here, an oxide semiconductor layer) of the pixel TFT 10, the upper metal layer M2, an interlayer insulating layer 13 covering the pixel TFT 10, the lower transparent conductive layer M3, a dielectric layer 17, and the upper transparent conductive layer M4 are provided in this order from the substrate 1 side. Between the semiconductor layer and the upper metal layer M2, a channel protection layer 16 may be formed. The pixel TFT 10 includes the bottom gate structure, and the lower metal layer M1 is a gate metal layer and the upper metal layer M2 is a source metal layer. The gate metal layer may include, in addition to the gate bus line GL, a gate electrode 3A, a CS capacitance wiring line (not illustrated), and the like of the pixel TFT 10. The source metal layer may include, in addition to the source bus line SL, a source electrode 8A and a drain electrode 9A of the pixel TFT 10. The lower transparent conductive layer M3 includes the common electrode CE as the lower transparent electrode 15, and the upper transparent conductive layer M4 includes the pixel electrode PE as the upper transparent electrode 19.

Next, a structure of the pixel TFT 10 will be described in more detail.

The pixel TFT 10 is a TFT including a bottom gate structure including the gate electrode 3A supported by the substrate 1, the gate insulating layer 5 covering the gate electrode 3A, an oxide semiconductor layer 7A formed on the gate insulating layer 5, and the source electrode 8A and the drain electrode 9A disposed to come into contact with the oxide semiconductor layer 7A. As illustrated, between the oxide semiconductor layer 7A, and the source electrode 8A and the drain electrode 9A, the channel protection layer (etch stop layer) 16 covering a channel region of the oxide semiconductor layer 7A may be provided. The source electrode 8A and the drain electrode 9A may each be in contact with the oxide semiconductor layer 7A in an opening of the channel protection layer 16.

The gate electrode 3A is connected to the corresponding one of the gate bus lines GL, and the source electrode 8A is connected to the corresponding one of the source bus lines SL. The drain electrode 9A is electrically connected to the pixel electrode PE. The gate electrode 3A and the gate bus line GL may be formed integrally in the gate metal layer (here, the lower metal layer M1). The source electrode 8A and the source bus line SL may be formed integrally in the source metal layer (here, the upper metal layer M2).

The interlayer insulating layer 13 is not particularly limited, and may include an inorganic insulating layer (passivation film) 11, and an organic insulating layer 12 disposed on the inorganic insulating layer 11, for example. Note that the interlayer insulating layer 13 may not include the organic insulating layer 12.

The pixel electrode PE and the common electrode CE are disposed to partially overlap with each other via the dielectric layer 17. The pixel electrodes PE are separated for each pixel. The common electrodes CE may not be separated for each pixel. In this example, the common electrode CE is formed on the interlayer insulating layer 13. The pixel electrode PE is formed on the dielectric layer 17, and is electrically connected to the drain electrode 9A in an opening CH1 provided in the interlayer insulating layer 13 and the dielectric layer 17. Although not illustrated, the pixel electrode PE includes at least one slit or cut-out portion for each pixel. The common electrode CE may be formed entirely throughout the pixel region P other than a region where the opening CH1 is formed.

Such an active matrix substrate 100 can be applied to a display device of the FFS mode, for example. The FFS mode is a mode of a lateral electric field method of providing a pair of electrodes in one of substrates, and applying an electric field to a liquid crystal molecule in a direction (lateral direction) parallel to a substrate plane. In this example, an electric field represented by an electric line of force output from the pixel electrode PE through a liquid crystal layer (not illustrated), and further through the opening having a shape of a slit of the pixel electrode PE to the common electrode CE. This electric field has a component in a lateral direction with respect to the liquid crystal layer. As a result, the electric field in the lateral direction can be applied to the liquid crystal layer. In the lateral electric field method, since no liquid crystal molecule rises up from the substrate, there is an advantage of achieving a wider viewing angle than a viewing angle in a longitudinal electric field method.

The electrode structure in which the pixel electrode PE is disposed on the common electrode CE via the dielectric layer 17 is described in WO 2012/086513, for example. Note that the common electrode CE may be disposed on the pixel electrode PE via the dielectric layer 17. Namely, the lower transparent electrode 15 formed in the lower transparent conductive layer M3 may be the pixel electrode PE, and the upper transparent electrode 19 formed in the upper transparent conductive layer M4 may be the common electrode CE. Such an electrode structure is described in JP 2008-032899 A and JP 2010-008758 A, for example. The entire contents of the disclosure of WO 2012/086513, JP 2008-032899 A, and JP 2010-008758 A are incorporated herein as reference.

A material and a thickness of each layer in the present embodiment are as follows, for example.

The substrate 1 can be, for example, a glass substrate, a silicon substrate, a plastic substrate (resin substrate) having heat resistance, or the like. The gate metal layer (for example, a thickness of 50 nm or more and 500 nm or less) is formed of a metal such as aluminum (Al), tungsten (W), molybdenum (Mo), tantalum (Ta), chromium (Cr), titanium (Ti), and copper (Cu), or an alloy thereof, or a metal nitride thereof, for example. In addition, the gate metal layer may also be formed of a layered film including a plurality of these films. The gate insulating layer (for example, a thickness of 200 nm or more and 500 nm or less) 5 is, for example, a silicon oxide (SiOx) layer, a silicon nitride (SiNx) layer, a silicon oxynitride (SiOxNy; x>y) layer, a silicon nitride oxide (SiNxOy; x>y) layer, or the like. The gate insulating layer 5 may include a layered structure. The semiconductor layer may be formed of an oxide semiconductor film (for example, a thickness of 15 nm or more and 200 nm or less), for example. The channel protection layer 16 (for example, a thickness of 30 nm or more and 200 nm or less) is, for example, a silicon oxide layer, a silicon nitride layer, a silicon oxynitride layer, or the like. The channel protection layer 16 may include a layered structure. The source metal layer (for example, a thickness of 50 nm or more and 500 nm or less) is formed by using a film including a metal such as aluminum (Al), tungsten (W), molybdenum (Mo), tantalum (Ta), chromium (Cr), titanium (Ti), and copper (Cu), or an alloy thereof, or a metal nitride thereof, for example. In addition, the source metal layer may also be formed of a layered film including a plurality of these films. The inorganic insulating layer (for example, a thickness of 100 nm to 500 nm, preferably 200 nm to 500 nm) 11 is formed of, for example, an inorganic insulating film (passivation film) such as a silicon oxide (SiOx) film, a silicon nitride (SiNx) layer, a silicon oxynitride (SiOxNy; x>y) film, a silicon nitride oxide (SiNxOy; x>y) film, or the like. The inorganic insulating layer 11 may include a layered structure. The organic insulating layer (for example, a thickness of 1 μm to 3 μm, preferably 2 μm to 3 μm) 12 is formed of an organic insulating film including a photosensitive resin material, for example. The lower transparent conductive layer M3 and the upper transparent conductive layer M4 (for example, a thickness of 50 nm or more and 200 nm or less) may each be formed of, for example, an indium tin oxide (ITO) film, an In—Zn—O based oxide (indium zinc oxide) film, a ZnO film (zinc oxide film), or the like. A second inorganic insulating layer (for example, a thickness of 70 nm or more and 300 nm or less) 17 may be formed of, for example, a silicon nitride (SiNx) film, a silicon oxide (SiOx) film, a silicon oxynitride (SiOxNy; x>y) film, a silicon nitride oxide (SiNxOy; x>y) film, or the like.

Configuration of Peripheral Circuit

In the non-display region FR of the active matrix substrate 100, a peripheral circuit including a TFT and a capacitance portion CAP is formed in a monolithic manner. Note that herein, at least one TFT (circuit TFT) constituting the peripheral circuit formed in a monolithic manner may be called a "first TFT," and the pixel TFT described above may be called a "second TFT." The peripheral circuit including the first TFT and the capacitance portion CAP is not particularly limited, and may be the gate driver GD, for example.

In the present embodiment, the capacitance portion CAP in the peripheral circuit includes a capacitor (called a "first capacitor") formed by using the lower transparent conductive layer M3 and the upper transparent conductive layer M4 described above. That is, the first capacitor includes a lower capacitance electrode formed in the lower transparent conductive layer M3, an upper capacitance electrode formed in the upper transparent conductive layer M4, and a capacitance insulator (here, the dielectric layer 17) positioned between these electrodes. Such a first capacitor is transparent. Note that the capacitance portion CAP may further include a capacitor (called a "second capacitor") formed by using the lower metal layer M1 and the upper metal layer M2.

In an active matrix substrate of the related art, a capacitance electrode of a peripheral circuit is formed by using a gate metal layer and a source metal layer. Such a capacitance electrode is typically formed of a metal film, and thus, it has been necessary to provide transparent portions (a plurality of openings or cut-out portions) configured to transmit light to cure a sealing member. In contrast, in the present embodiment, the capacitance portion CAP includes the first capacitor formed by using the lower transparent conductive layer M3 and the upper transparent conductive layer M4. The first capacitor is transparent, and it is unnecessary to provide a transparent portion to cure a sealing member. Therefore, area or a width (layout area or a layout width) required to form the capacitance portion CAP can be reduced while a predetermined capacitance value is secured, and circuit area can be reduced.

Hereinafter, the gate driver GD will be described specifically as an example of a configuration of the capacitance portion CAP in the present embodiment.

Configuration and Action of Monolithic Gate Driver

Circuit Configuration of Gate Driver

First, a circuit configuration and action of the gate driver GD formed in the active matrix substrate 100 will be described. The gate driver GD includes a shift register. The shift register includes a plurality of unit circuits connected in a multistage.

Figure 3:
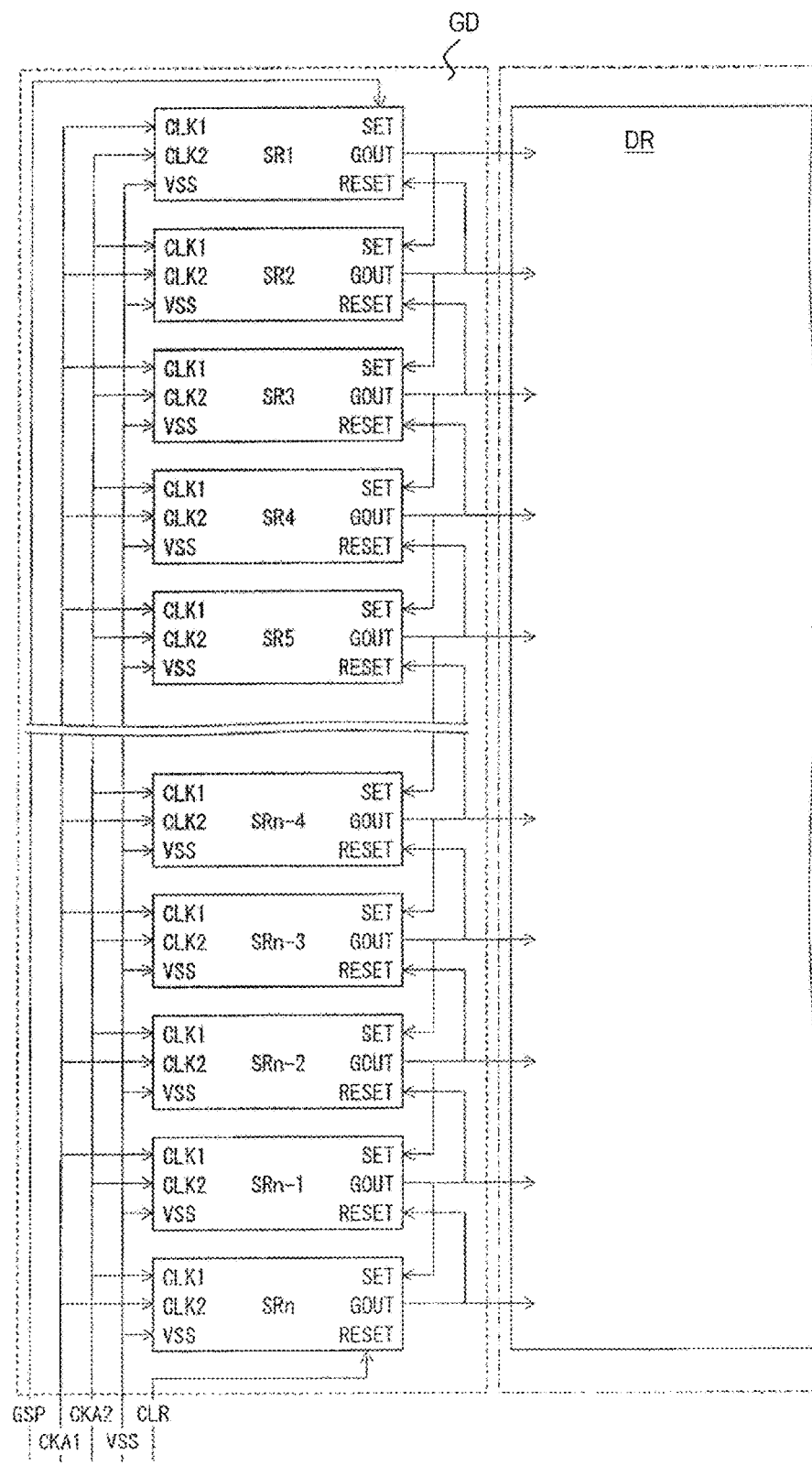
FIG. 3 is a diagram exemplifying a shift register circuit constituting a gate driver (monolithic gate driver) GD.

FIG. 3 is a diagram exemplifying a shift register circuit constituting the gate driver (monolithic gate driver) GD.

The shift register circuit includes a plurality of unit circuits SR1 to SRn. Unit circuits SRk in the stages (k is a natural number of 1≤k≤n) each include a set terminal configured to receive a set signal SET, an output terminal configured to output an output signal GOUT, a reset terminal configured to receive a reset signal RESET, a low power source input terminal configured to receive a low power source potential VSS, and clock input terminals configured to receive clock signals CLK1 and CLK2. In each of the unit circuits SRk (k≥2), the set terminal receives an output signal GOUTk−1 of a unit circuit SRk−1 in a former stage. The set terminal of the unit circuit SR1 in the first stage receives a gate start pulse signal GSP. In each of the unit circuits SRk (k≥1) in the stages, the output terminal outputs an output signal GOUTk to the corresponding scanning signal line disposed in the display region. The reset terminal of each of the unit circuits SRk (k≤n−1) receives an output signal GOUTk+1 of the unit circuit SRk+1 in the next stage. The reset terminal of the unit circuit SRn in the final stage receives a clear signal CLR.

The low power source input terminal receives the low power source potential VSS being a power source voltage on the low-potential side in each of the unit circuits SRk. One of the two clock input terminals receives the clock signal CLK1, and the other of the clock input terminals receives the clock signal CLK2. The clock signals to be input to the respective clock input terminals are configured to be alternately switched between adjacent stages.

The clock signal CLK1 and the clock signal CLK2 have a complementary phase relationship in which active clock pulse periods (here, high-level periods) do not overlap with each other. A voltage on the high level side (active side) of each of the clock signals CLK1 and CLK2 is VGH, and a voltage on the low level side (non-active side) of each of the clock signals CLK1 and CLK2 is VGL. The low power source voltage VSS is equal to the voltage VGL on the low level side of each of the clock signals CLK1 and CLK2. The clock signal CLK1 and the clock signal CLK2 may have a relationship in which phases of the clock signal CLK1 and the clock signal CLK2 are opposite to each other. Alternatively, the active clock pulse period of one of the clock signals may be present in a non-active period of the other of the clock signals (namely, a clock duty is less than ½).

The gate start pulse signal GSP is a signal active in a first clock pulse period of one flame period. The clear signal CLR is a signal active (here, high) in a final clock pulse period of the one flame period.

In the shift register circuit, the gate start pulse signal GSP is input to the set terminal of the unit circuit SR1 in the first stage as a shift pulse in the beginning of one flame period. In the shift register circuit, the unit circuits SRk in the stages being cascade-connected deliver this shift pulse in order, and accordingly, an active pulse of the output signal GOUTk is output.

Figure 4A:
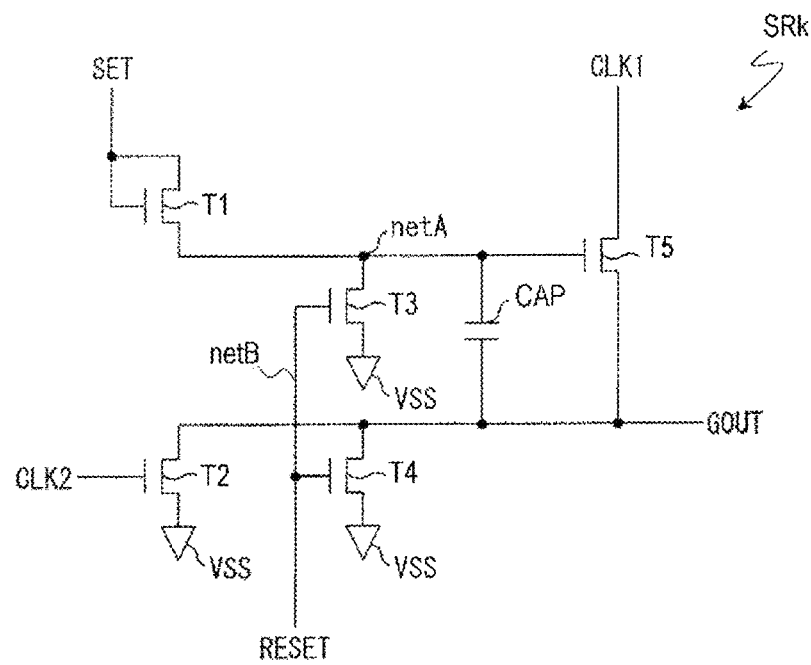
FIG. 4A is a diagram illustrating an example of a unit circuit SRk.
Figure 4B:
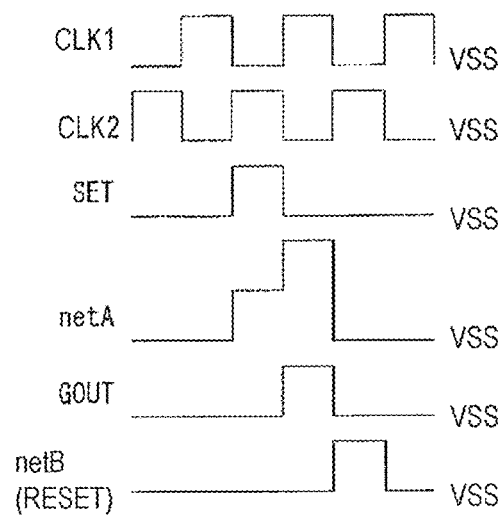
FIG. 4B is a diagram illustrating a signal waveform in the unit circuit SRk.

FIG. 4A is a diagram illustrating an example of each unit circuit SRk. FIG. 4B is a diagram illustrating a signal waveform in the unit circuit SRk.

The unit circuit SRk includes five thin film transistors of an n-channel type T1 to T5, and the capacitance portion CAP.

The T1 is an input transistor. A gate and a drain of the T1 are connected to the set terminal, and a source of the T1 is connected to a gate of the T5. The T5 is an output transistor. A drain of the T5 is connected to the clock input terminal, and a source of the T5 is connected to the output terminal. Namely, the T5 serves as a transmission gate to perform passing and blocking of the clock signal CLK1 to be input to the clock input terminal.

The capacitance portion CAP is connected between the gate and the source of the T5 being an output transistor. Herein, the capacitance portion CAP may be called a "bootstrap capacitance portion." In addition, a node connected to a gate of the T5 is referred to as a "node netA," and a node connected to the output terminal is referred to as a "node GOUT." One of the electrodes of the capacitance portion CAP is connected to the gate of the T5 and the node netA, and the other electrode is connected to the source of the T5 and the node GOUT.

The T3 is disposed between the low power source input terminal and the node netA. The T3 serves as a pull-down transistor to reduce a potential at the node netA. A gate of the T3 is connected to the reset terminal, and a drain of the T3 is connected to the node netA, and a source of the T3 is connected to the low power source input terminal. A node connected to the gate of the pull-down transistor (here, the T3) is referred to as a "node netB."

The node GOUT is connected to the T2 and the T4. A gate of the T4 is connected to the reset terminal, and a drain of the T4 is connected to the output terminal, and a source of the T4 is connected to the low power source input terminal. A gate of the T2 is connected to the input terminal of the clock signal CLK2, and a drain of the T2 is connected to the node GOUT, and a source of the T2 is connected to the low power source input terminal.

In the unit circuit SRk, a period until a shift pulse is input to the set terminal is a period in which the T4 and the T5 are each in a high impedance state and the T2 becomes in an ON state every time when the clock signal CLK2 input from the clock input terminal becomes at a high level, and the output terminal holds low.

As illustrated in FIG. 4B, when the shift pulse is input to the set terminal, a period of generating a gate pulse being an active pulse of the output signal GOUT is started, and the T1 becomes in an ON state to charge the capacitance portion CAP. The capacitance portion CAP is charged, and accordingly, a potential V(netA) at the node netA increases to VGH−Vth ($V_{(netA)}$=VGH−Vth) where a high level of the gate pulse is VGH, and a threshold voltage of the T1 is Vth. As a result, the T5 become in an ON state, and the clock signal CLK1 input from the clock input terminal appears in the source of the T5. At the moment when this clock pulse (high level) is input, a potential at the node netA is suddenly increased due to a bootstrap effect of the capacitance portion CAP, and thus, the T5 obtains a large over-drive voltage. Accordingly, almost a total amplitude of the VGH of the clock pulse input to the clock input terminal is transmitted to the output terminal, and becomes the gate pulse.

When the input of the shift pulse to the set terminal ends, the T1 becomes in an OFF state, and the node netA is held in a floating state. After the gate output (GOUT) is complete, a floating state of each node is released by a reset pulse signal. Specifically, a gate pulse of the unit circuit SRk+1 in the next stage is input to the reset terminal. Accordingly, the T3 and the T4 become in an ON state, and the node netA and the output terminal are connected to the low power source voltage VSS. Therefore, the T5 becomes in an OFF state. When the input of the reset pulse ends, a period of generating the gate pulse of this unit circuit SRk ends, and the output terminal is again in a period of holing low.

Configuration of Output Transistor T5 and Capacitance Portion CAP

Then, a configuration of each of the output transistor T5 and the capacitance portion (bootstrap capacitance portion) CAP in the gate driver GD will be described.

Figure 5A:
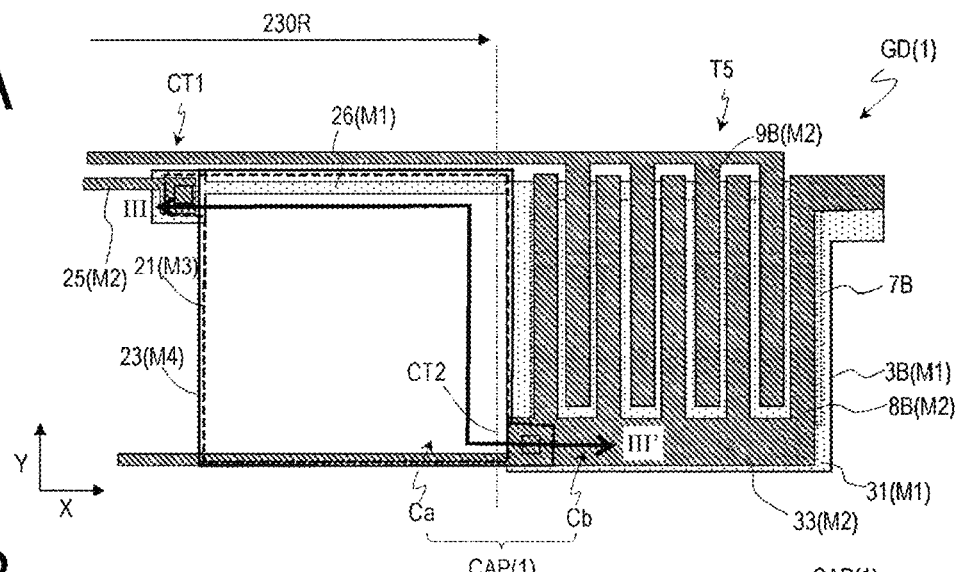
FIGS. 5A and 5B are respectively a plan view exemplifying a portion of a gate driver GD(1) in a first embodiment and a cross-sectional view taken along line III-III' of the portion.
Figure 5B:
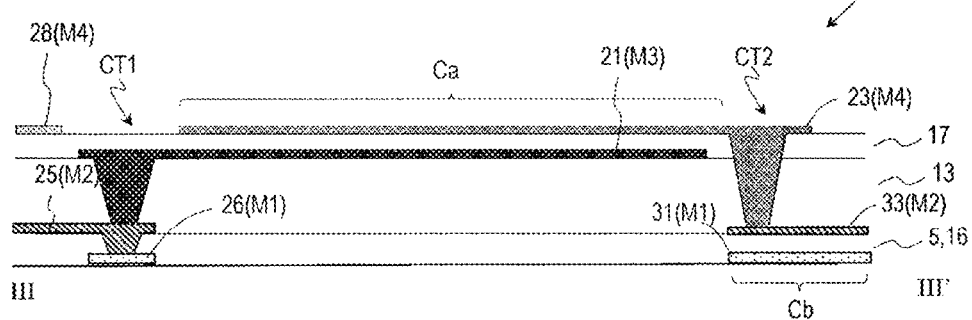
Figure 5C:
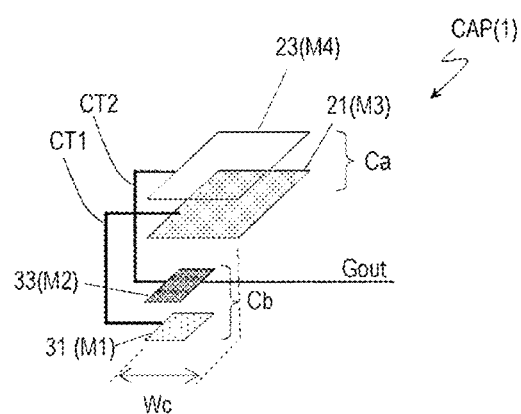
FIG. 5C is a schematic view for explaining a capacitance portion CAP(1) in the gate driver GD(1).

FIGS. 5A and 5B are respectively a plan view exemplifying a portion of a gate driver GD(1) in the present embodiment and a cross-sectional view taken along line III-III' of the portion. FIG. 5C is a schematic view for explaining a capacitance portion CAP(1) in the gate driver GD(1).

The gate driver GD(1) includes the output transistor T5 and the capacitance portion CAP(1). In this example, the output transistor T5 and the capacitance portion CAP(1) are disposed adjacent to each other in one direction (X-direction), and the output transistor T5 is positioned closer to the display region side than the capacitance portion CAP(1). Note that the capacitance portion CAP(1) may be positioned closer to the display region side than the output transistor T5.

As viewed from a normal direction of the substrate, at least a portion of the gate driver GD(1) may be disposed to overlap with a region (hereinafter referred to as a "seal region") 230R where the sealing portion 230 (FIG. 1B) is formed. For example, at least a portion of the capacitance portion CAP(1) may overlap with the seal region 230R. The seal region 230R may extend across the gate driver GD(1) in a Y-direction, for example.

In this example, as viewed from the normal direction of the substrate, the output transistor T5 in the unit circuit SRk of the gate driver GD(1) is positioned closer to the display region side than the seal region 230R, and other circuits TFT constituting the gate driver and the capacitance portion CAP(1) are disposed to overlap with the seal region 230R. Note that an arrangement relationship between the seal region 230R and the gate driver is not limited to this example. Typically, the seal region 230R is disposed to at least partially overlap with the capacitance portion CAP(1), or is disposed near or at the capacitance portion CAP(1).

The output transistor T5 is an oxide semiconductor TFT including a bottom gate structure. The output transistor T5 includes a gate electrode 3B, the gate insulating layer 5 covering the gate electrode 3B, an oxide semiconductor layer 7B disposed to overlap with the gate electrode 3B via the gate insulating layer 5, and a source electrode 8B and a drain electrode 9B electrically connected to the oxide semiconductor layer 7B. The gate electrode 3B is formed in the lower metal layer M1, and the source electrode 8B and the drain electrode 9B are formed in the upper metal layer M2. The channel protection layer 16 may be provided between the oxide semiconductor layer 7B, and the source electrode 8B and the drain electrode 9B.

The output transistor T5 and other circuits TFT constituting the gate driver may be formed at the step common to the step for the pixel TFT 10, for example. The output transistor T5 may be configured to have a channel width larger than a channel width of each of the other circuits TFT. For example, each of the source electrode 8B and the drain electrode 9B of the output transistor T5 may include a so-called comb teeth structure. That is, the source electrode 8B and the drain electrode 9B may each include, for example, a main portion extending in the X-direction, and a plurality of branch portions (comb teeth portion) extending from the main portion in a direction (Y-direction) intersecting the X-direction, and may be disposed to face each other to make the comb teeth portions of the source electrode 8B and the drain electrode 9B engage with each other.

As illustrated in FIGS. 5B and 5C, the capacitance portion CAP(1) includes a transparent capacitor (first capacitor) Ca formed by using the lower transparent conductive layer M3 and the upper transparent conductive layer M4. The capacitance portion CAP(1) may further include a capacitor (second capacitor) Cb formed on the substrate side of the first capacitor Ca by using the lower metal layer M1 and the upper metal layer M2. The first capacitor Ca and the second capacitor Cb are connected in parallel.

The first capacitor Ca includes a lower capacitance electrode (may be called a "first lower capacitance electrode") 21, an upper capacitance electrode (may be called a "first upper capacitance electrode") 23, and a portion positioned between these capacitance electrodes in the dielectric layer 17. The lower capacitance electrode 21 is a transparent electrode formed in the lower transparent conductive layer M3, and the upper capacitance electrode 23 is a transparent electrode formed in the upper transparent conductive layer M4.

The lower capacitance electrode 21 and the upper capacitance electrode 23 are disposed to at least partially overlap with each other via the dielectric layer 17. One of the lower capacitance electrode 21 and the upper capacitance electrode 23 is electrically connected at a first contact portion CT1 to the gate electrode 3B of the output transistor T5 and the node netA. The other of the lower capacitance electrode 21 and the upper capacitance electrode 23 is electrically connected at a second contact portion CT2 to the source electrode 8B of the output transistor T5 and the node GOUT.

Meanwhile, the second capacitor Cb includes a lower capacitance electrode (may be called a "second lower capacitance electrode") 31 formed in the lower metal layer M1, an upper capacitance electrode 33 (may be called a "second upper capacitance electrode") formed in the upper metal layer M2, and a capacitance insulator positioned between these electrodes. The lower capacitance electrode 31 may be an extending section of the gate electrode 3B of the output transistor T5, and the upper capacitance electrode 33 may be an extending section of the source electrode 8B of the output transistor T5. Between these capacitance electrodes, the gate insulating layer 5 (or the gate insulating layer 5 and the channel protection layer 16) is positioned. The lower capacitance electrode 31 is electrically connected to the gate electrode 3B of the output transistor T5 and the node netA, and the upper capacitance electrode 33 is electrically connected to the source electrode 8B of the output transistor T5 and the node GOUT.

In the gate driver GD(1) illustrated in FIGS. 5A to 5C, the lower capacitance electrode 21 of the first capacitor Ca may be in contact with the upper metal connection portion 25 in an opening formed in the interlayer insulating layer 13 in the first contact portion CT1, and the upper metal connection portion 25 of the first capacitor Ca may be in contact with the lower metal connection portion 26 in an opening formed in the gate insulating layer 5 (or the gate insulating layer 5 and the channel protection layer 16). The upper metal connection portion 25 is formed in the upper metal layer M2, and constitutes the node netA. The lower metal connection portion 26 is formed in the lower metal layer M1, and is electrically connected to (here, integrally formed with) the lower capacitance electrode 31 and the gate electrode 3B.

The upper capacitance electrode 23 may be in contact with the upper capacitance electrode 33 in the opening formed in the interlayer insulating layer 13 and the dielectric layer 17 in the second contact portion CT2. The upper capacitance electrode 33 is electrically connected to (here, integrally formed with) the source electrode 8B and the node GOUT.

The first capacitor Ca may be disposed throughout a circuit width in the Y-direction. Meanwhile, the second capacitor Cb may be disposed in a portion of the circuit width in the Y-direction. For example, the second capacitor Cb may be provided adjacent to the output transistor T5 in the Y-direction. Accordingly, the second capacitor Cb can be formed without increasing a circuit width (layout width) in the X-direction. As illustrated, a width of a portion (main portion) extending in the X-direction of the source electrode 8B is increased, and the first contact portion CT1 and the second capacitor Cb may be provided in a region in the main portion where the first contact portion CT1 and the second capacitor Cb do not overlap with the oxide semiconductor layer 7B.

An overlapping area of the lower capacitance electrode 21 and the upper capacitance electrode 23, and an overlapping area of the lower capacitance electrode 31 and the upper capacitance electrode 33 are appropriately set to make the capacitance portion CAP have predetermined capacitance.

On a portion other than the output transistor T5 and the capacitance portion CAP of the gate driver, a shield layer 28 may be formed. The shield layer 28 may be formed in the lower transparent conductive layer M3 or the upper transparent conductive layer M4 (here, the upper transparent conductive layer M4), for example. When the shield layer is formed by using the lower transparent conductive layer M3 or the upper transparent conductive layer M4, the shield layer 28 and the lower capacitance electrode 21 or the upper capacitance electrode 23 of the capacitance portion CAP are disposed to be spaced apart at an interval equal to or more than a distance between the pixels in the display region, for example.

Figure 6A:
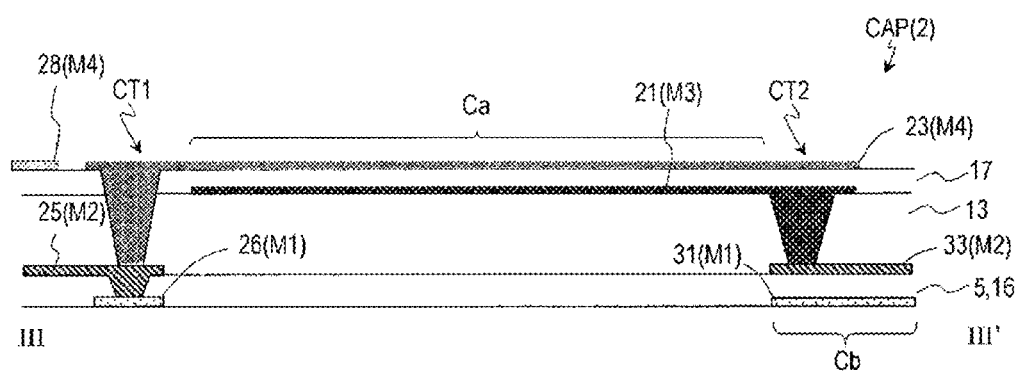
FIGS. 6A and 6B are respectively a cross-sectional view and a schematic view illustrating another capacitance portion CAP(2) in the first embodiment.
Figure 6B:
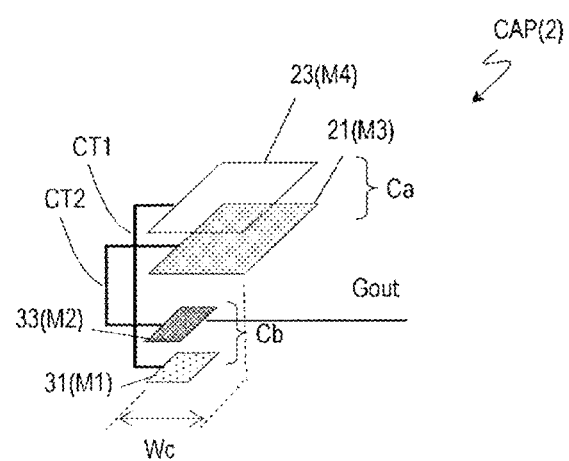

FIGS. 6A and 6B are respectively a cross-sectional view and a schematic view illustrating another capacitance portion CAP(2) of the present embodiment.

As exemplified in FIGS. 6A and 6B, the lower capacitance electrode 21 may be in contact with the upper capacitance electrode 33 in an opening formed in the interlayer insulating layer 13 in the second contact portion CT2, and may be connected electrically to the source electrode 8B and the node GOUT via the upper capacitance electrode 33. The upper capacitance electrode 23 may be in contact with the upper metal connection portion 25 in an opening formed in the dielectric layer 17 and the interlayer insulating layer 13 in the first contact portion CT1, and the upper metal connection portion 25 may be in contact with the lower metal connection portion 26 in an opening formed in the gate insulating layer 5 and the channel protection layer 16. The upper capacitance electrode 23 may be connected electrically to the node netA via the upper metal connection portion 25, and may be connected electrically to the gate electrode 3B and the lower capacitance electrode 31 via the lower metal connection portion 26.

As described above, in an active matrix substrate of the related art, a capacitance portion (bootstrap capacitance portion) is formed by using a gate metal layer and a source metal layer, and the capacitance portion is large in size, and thus, it has been difficult to reduce circuit area of a gate driver. In addition, when the gate driver and the seal region is caused to overlap with each other to narrow a frame, an electrode of the capacitance portion is provided with transparent portions (a plurality of openings or cut-out portions) configured to transmit light to cure a sealing member, and thus, there has been a problem of a further increase in area required for the capacitance portion. In contrast, in the present embodiment, the lower capacitance electrode 21 and the upper capacitance electrode 23 of the first capacitor Ca are each formed of a transparent conductive film, and thus, it is unnecessary to provide a transparent portion to cure the sealing member. In addition, the second capacitor Cb is disposed only in a portion of the circuit width in the Y-direction, and the sealing member can be cured without providing a transparent portion in the second capacitor Cb. Thus, area or a width (layout area or a layout width) required to form the capacitance portion CAP can be reduced, and the circuit area can be reduced, as compared to in the active matrix substrate of the related art.

In the present embodiment, the lower capacitance electrode 21 and the upper capacitance electrode 23 are each formed by using the same transparent conductive film as a transparent conductive film of the common electrode or the pixel electrode, but as long as these capacitance electrodes are formed by using a transparent conductive film, these capacitance electrodes may each be formed by using a film different from the film of each of the common electrode and the pixel electrode. In addition, the layout of the capacitance portion CAP and the output transistor T5, and the positional relationship with the seal region 230R are not limited to the example illustrated. For example, the capacitance portion CAP may be disposed closer to the display region side than the output transistor T5.

Figure 7A:
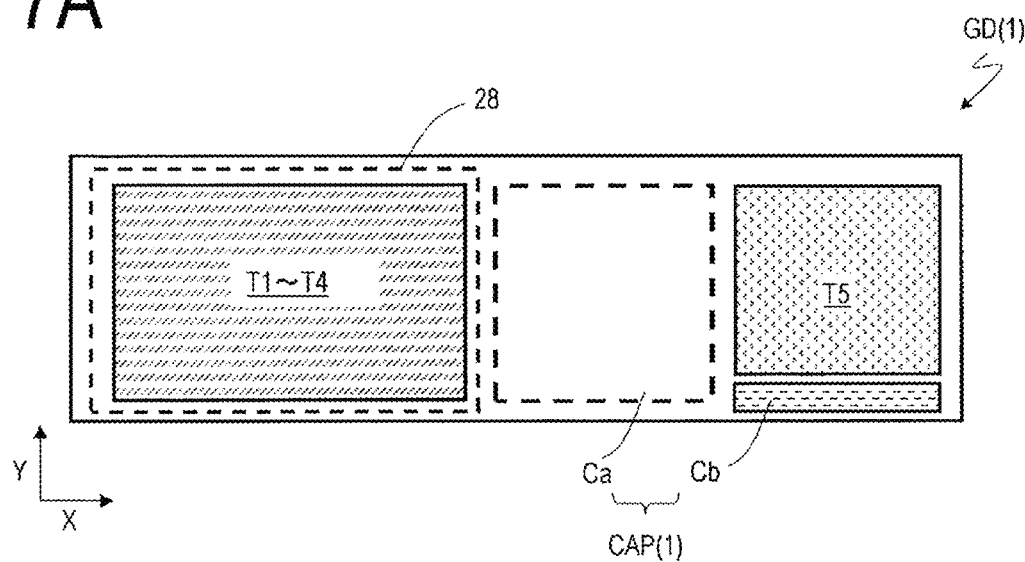
FIGS. 7A and 7B are plan views schematically illustrating the gate driver GD(1) and another gate driver GD(3), respectively.
Figure 7B:
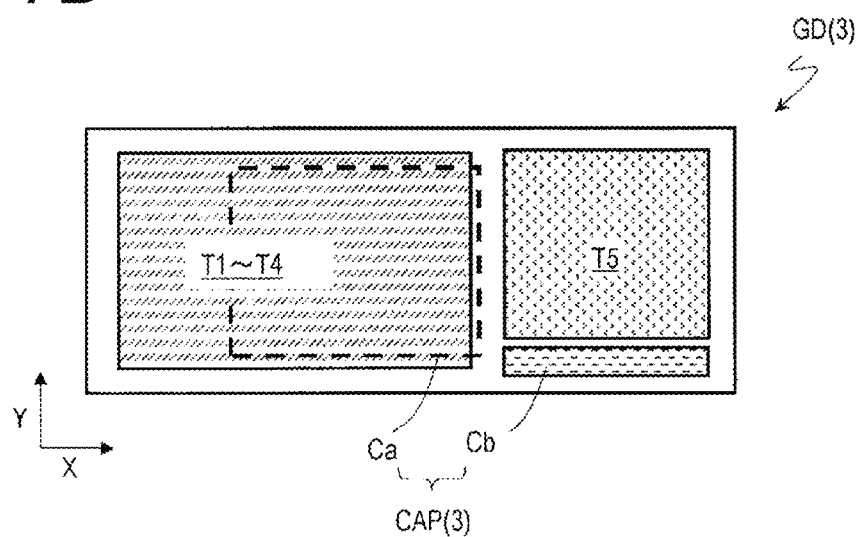

Note that no shield layer may be provided on the gate driver GD. In this case, a portion of or all of the first capacitor Ca of the capacitance portion CAP may be disposed on a circuit element and a wiring line constituting the gate driver GD. FIGS. 7A and 7B are plan views schematically illustrating the gate driver GD(1) and another gate driver GD(3) in the present embodiment, respectively. As illustrated in FIG. 7B, the first capacitor Ca of the capacitance portion CAP is disposed to overlap with other circuit elements or wiring lines, and accordingly, area or a width required for the gate driver can further be reduced.

Second Embodiment

In an active matrix substrate of a second embodiment, a capacitance portion CAP includes a first capacitor Ca formed of a lower transparent conductive layer M3 and an upper transparent conductive layer M4, and a second capacitor Cb formed of a lower metal layer M1 and an upper metal layer M2. The first capacitor Ca and the second capacitor Cb are connected in parallel. In addition, the first capacitor Ca and the second capacitor Cb are disposed to at least partially overlap with each other as viewed from a normal direction of the substrate. Other configurations may be similar to the configurations of the active matrix substrate of the first embodiment. Hereinafter, a difference from the first embodiment will be described mainly, and description of a similar configuration will be omitted.

Figure 8A:
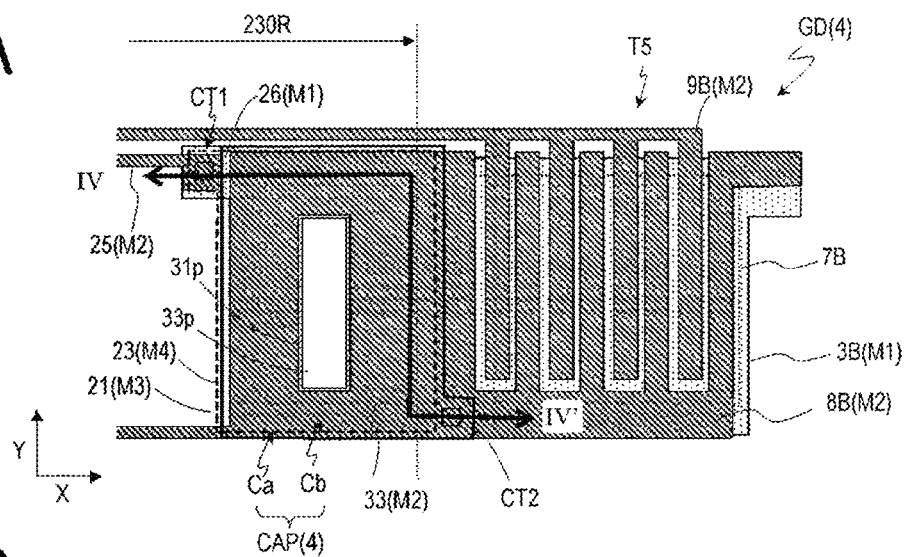
FIGS. 8A and 8B are respectively a plan view exemplifying a portion of a gate driver GD(4) in a second embodiment and a cross-sectional view taken along line IV-IV' of the portion.
Figure 8B:
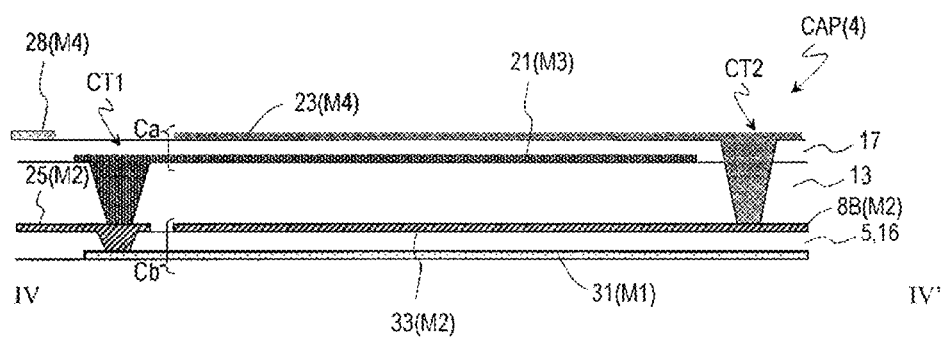
Figure 8C:
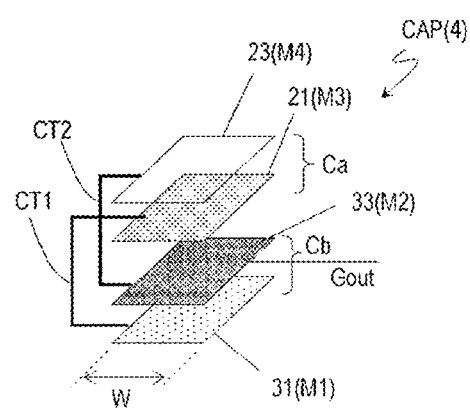
FIG. 8C is a schematic view for explaining a capacitance portion CAP(4) in the gate driver GD(4).

FIGS. 8A and 8B are respectively a plan view exemplifying a portion of a gate driver GD(4) and a cross-sectional view taken along line IV-IV' of the portion. FIG. 8C is a schematic view for explaining a capacitance portion CAP(4) in the gate driver GD(4).

As with the embodiment described above (FIGS. 5A to 5C), the first capacitor Ca includes a lower capacitance electrode 21 formed in the lower transparent conductive layer M3, an upper capacitance electrode 23 formed in the upper transparent conductive layer M4, and a portion positioned between these capacitance electrodes of a dielectric layer 17. The first capacitor Ca is a transparent capacitor, and thus a transparent portion configured to cure a sealing member may not be provided.

The second capacitor Cb includes a lower capacitance electrode 31 formed in the lower metal layer M1, an upper capacitance electrode 33 formed in the upper metal layer M2 and a capacitance insulator positioned between these electrodes. The capacitance insulator includes a portion positioned between the lower capacitance electrode 31 and the upper capacitance electrode 33 of a gate insulating layer 5. When an output transistor T5 is a TFT of an etch stop type, the capacitance insulator may include the gate insulating layer 5 and a channel protection layer 16. The lower metal layer M1 is a gate metal layer, for example, and the upper metal layer M2 is a source metal layer, for example.

The lower capacitance electrode 31 is electrically connected to a gate electrode 3B of the output transistor T5 and a node netA, and the upper capacitance electrode 33 is electrically connected to a source electrode 8B of the output transistor T5 and a node GOUT. As illustrated, the lower capacitance electrode 31 may be formed integrally with the gate electrode 3B, and the upper capacitance electrode 33 may be formed integrally with the source electrode 8B.

The lower capacitance electrode 31 and the upper capacitance electrode 33 may be disposed to at least partially overlap with each other via the capacitance insulator (here, the gate insulating layer 5 and the channel protection layer 16). The lower capacitance electrode 31 and the upper capacitance electrode 33 are each a metal electrode. The lower capacitance electrode 31 and the upper capacitance electrode 33 include transparent portions (openings) 31p and 33p configured to cure a sealing member, respectively. The number and shapes of the transparent portions (openings) 31p and 33p are not limited to the number and the shapes in the example illustrated. However, the opening 31p of the lower capacitance electrode 31 and the opening 33p of the upper capacitance electrode 33 are disposed to at least partially overlap with each other as viewed from the normal direction. Note that the lower capacitance electrode 31 and the upper capacitance electrode 33 may include cut-out portions instead of the openings 31p and 33p or in addition to the openings 31p and 33p. When the second capacitor Cb is disposed throughout a circuit width in a Y-direction, it is preferable to provide a transparent portion. However, when the second capacitor Cb is disposed only in a portion of the circuit width in the Y-direction and light irradiation of the sealing member is not blocked, the second capacitor Cb may be provided with no transparent portion.

The lower capacitance electrode 31 may be formed in one (lower metal layer M1) of the gate metal layer and the source metal layer disposed on the substrate side, and the upper capacitance electrode 33 may be formed in the other (upper metal layer M2) of the gate metal layer and the source metal layer. In this example, the lower capacitance electrode 31 is formed in the gate metal layer and the upper capacitance electrode 33 is formed in the source metal layer, but when the output transistor T5 includes a top gate structure, the lower capacitance electrode 31 can be formed in the source metal layer, and the upper capacitance electrode 33 can be formed in the gate metal layer.

Further, the lower capacitance electrode 31 and/or the upper capacitance electrode 33 may be formed in a conductive layer other than the source metal layer and the gate metal layer, such as a semiconductor layer of a pixel TFT or a conductive layer obtained by reducing resistance of a semiconductor layer. Namely, the lower metal layer M1 and/or the upper metal layer M2 may each be a conductive layer other than the source metal layer and the gate metal layer.

While both of the lower capacitance electrode 31 and the upper capacitance electrode 33 are metal electrodes in this example, only one of the lower capacitance electrode 31 and the upper capacitance electrode 33 may be a metal electrode. The metal electrode includes a transparent portion configured to cure the sealing member.

One of the lower capacitance electrode 21 and the upper capacitance electrode 23 of the first capacitor Ca is connected to the lower capacitance electrode 31 of the second capacitor Cb in a first contact portion CT1, and is electrically connected to the gate electrode 3B of the output transistor T5 and the node netA via the lower capacitance electrode 31. The other of the lower capacitance electrode 21 and the upper capacitance electrode 23 is connected to the upper capacitance electrode 33 and the source electrode 8B of the second capacitor Cb in a second contact portion CT2, and is electrically connected to the node GOUT via the source electrode 8B.

In this example, the lower capacitance electrode 21 may be in contact with the upper metal connection portion 25 in an opening formed in an interlayer insulating layer 13 in the first contact portion CT1, and the upper metal connection portion 25 may be in contact with the lower capacitance electrode 31 in an opening formed in the gate insulating layer 5. The upper metal connection portion 25 is formed in the upper metal layer M2, and constitutes the node netA. The lower capacitance electrode 31 is formed in the lower metal layer M1, and is electrically connected to (here, integrally formed with) the gate electrode 3B.

The upper capacitance electrode 23 may be in contact with the upper capacitance electrode 33 in an opening formed in the interlayer insulating layer 13 and the dielectric layer 17 in the second contact portion CT2. The upper capacitance electrode 33 is electrically connected to (here, integrally formed with) the source electrode 8B of the output transistor T5 and the node GOUT.

Figure 9A:
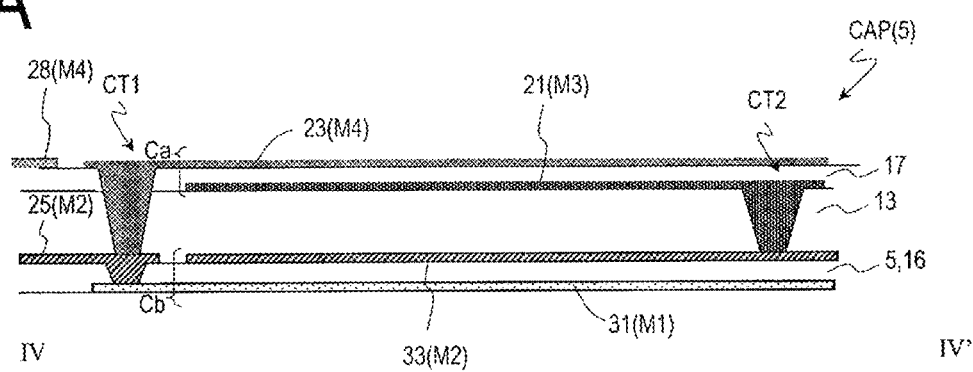
FIGS. 9A and 9B are respectively a cross-sectional view and a schematic view illustrating another capacitance portion CAP(5) in the first embodiment.
Figure 9B:
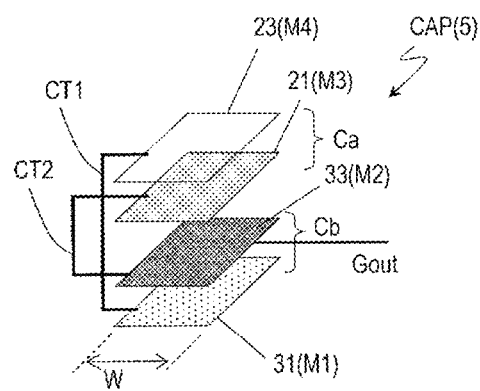
Figure 10A:
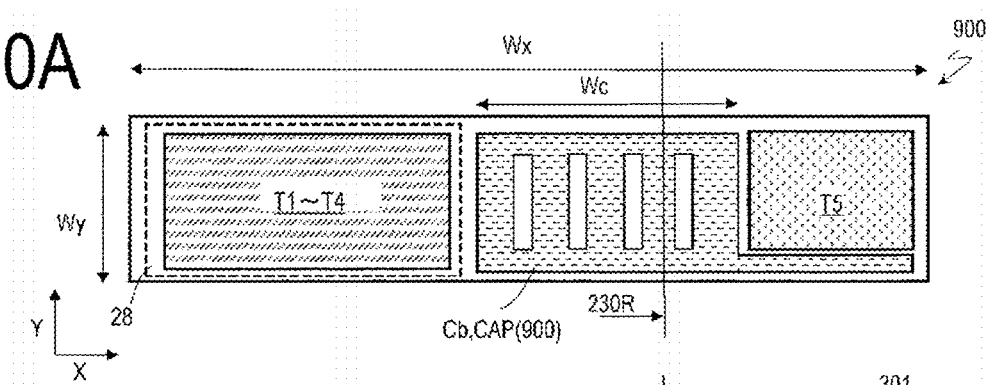
FIGS. 10A to 10D are plan views schematically illustrating a gate driver 900 of Comparative Example, and the gate drivers GD(1), GD(4), and GD(3) of the embodiments, respectively.
Figure 10B:
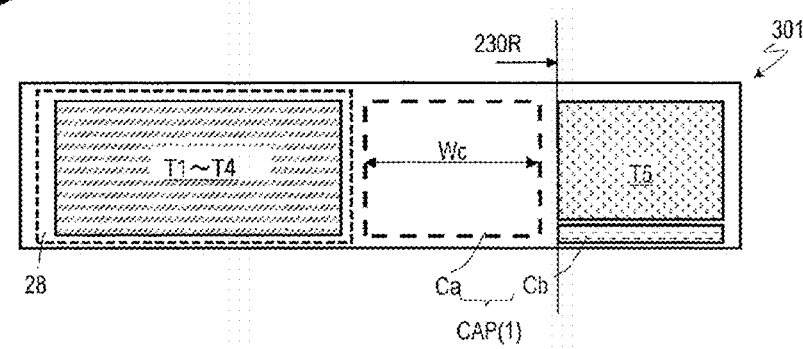
Figure 10C:
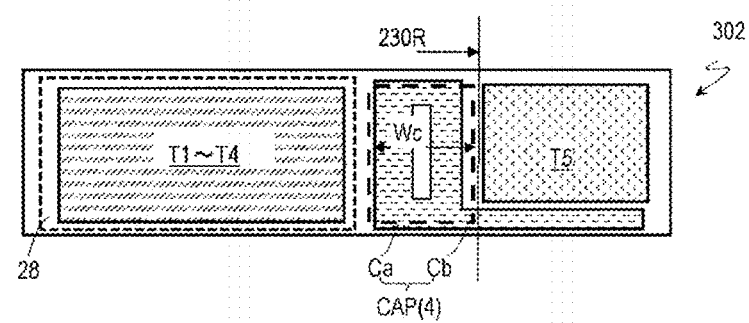
Figure 10D:
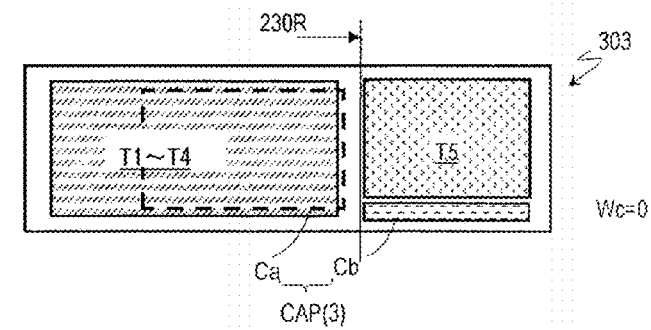

FIGS. 9A and 9B are respectively a cross-sectional view and a schematic view illustrating another capacitance portion CAP(5) of the present embodiment.

As exemplified in FIGS. 9A and 9B, the lower capacitance electrode 21 may be in contact with the upper capacitance electrode 33 in an opening formed in the interlayer insulating layer 13 in the second contact portion CT2, and may be connected electrically to the source electrode 8B and the node GOUT via the upper capacitance electrode 33. The upper capacitance electrode 23 may be in contact with the upper metal connection portion 25 in an opening formed in the dielectric layer 17 and the interlayer insulating layer 13 in the first contact portion CT1, and the upper metal connection portion 25 may be in contact with the lower capacitance electrode 31 in an opening formed in the gate insulating layer 5. The upper capacitance electrode 23 may be connected electrically to the node netA via the upper metal connection portion 25, and may be connected electrically to the gate electrode 3B via the lower capacitance electrode 31.

In the present embodiment, the first capacitor Ca and the second capacitor Cb at least partially overlap with each other as viewed from the normal direction of the substrate. Accordingly, area or a width (layout area or a layout width) required for the capacitance portion CAP can further be reduced, as compared to in the first embodiment. Similarly, in the present embodiment, overlapping area of the lower capacitance electrode 21 and the upper capacitance electrode 23, and overlapping area of the lower capacitance electrode 31 and the upper capacitance electrode 33 are appropriately set to make the capacitance portion CAP have predetermined capacitance.

When a shield layer 28 is not provided on the gate driver GD, the first capacitor Ca may be disposed not only on the second capacitor Cb but also on another circuit element. Accordingly, circuit area can further be reduced.

Estimation of Area and Capacitance of Capacitance Portion CAP

Here, capacitance and a size of the capacitance portion CAP in each of the first and second embodiments were estimated, and results of the estimation will be described.

Figure 14A:
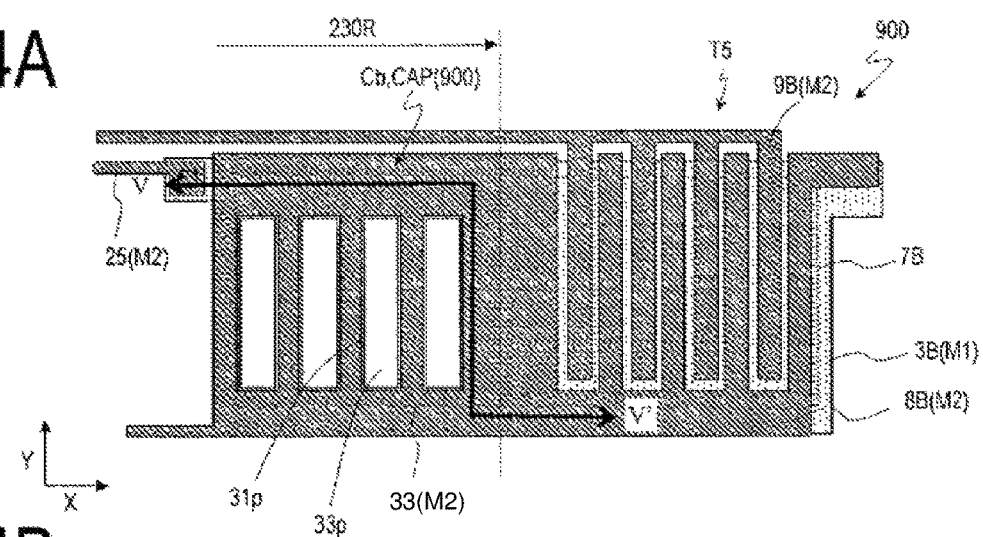
FIGS. 14A and 14B are respectively a plan view and a cross-sectional view taken along line V-V' of an output transistor T5 and a capacitance portion CAP(900) in a gate driver 900 of Comparative Example.
Figure 14B:
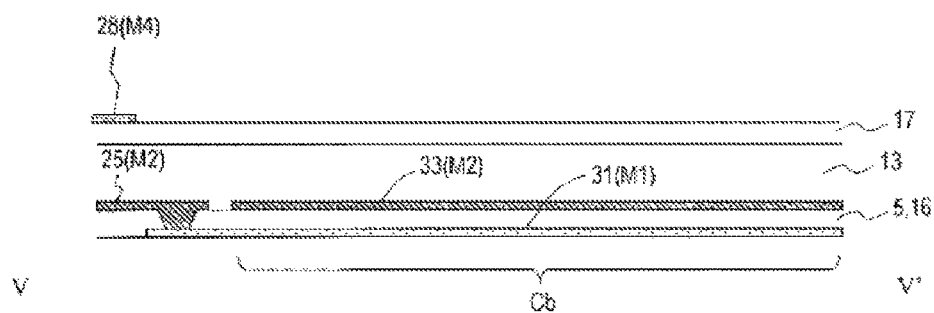

Note that for comparison, a size of the capacitance portion CAP including only the second capacitor Cb using the lower metal layer M1 and the upper metal layer M2 was also estimated. FIGS. 14A and 14B are respectively a plan view and a cross-sectional view of an output transistor T5 and a capacitance portion CAP(900) in a gate driver 900 of Comparative Example. In FIGS. 14A and 14B, the same reference numerals are denoted by the same configurations as the configurations in FIGS. 8A and 8B. The capacitance portion CAP(900) of Comparative Example includes the second capacitor Cb, and does not includes the first capacitor Ca being transparent. Any of the capacitance electrodes 31 and 33 of the second capacitor Cb is a metal electrode, and includes the plurality of openings 31p and 33p serving as transparent portions.

FIGS. 10A to 10D are plan views schematically illustrating the gate driver 900 (FIGS. 14A and 14B) of Comparative Example, and gate drivers 301, 302, and 303 of Examples 1 to 3, respectively. The gate drivers 301, 302, and 303 of Examples 1 to 3 have structures similar to the structures of the gate driver GD(1) (FIGS. 5A to 5C), the gate driver GD(4) (FIGS. 8A to 8C), and the gate driver GD(3) (FIGS. 7A and 7B), respectively.

Here, it is assumed that a direction in which a seal region 230R extends is a Y-direction, and a direction orthogonal to the Y-direction is an X-direction, and each circuit is formed across the seal region 230R in the X-direction. In addition, a width Wc in the X-direction required to form the capacitance portion CAP was calculated assuming that a width Wy in the Y-direction of each circuit is constant, and an extent of reduction in a width Wx in the X-direction of each circuit was investigated.

In the estimation, unit capacitance per unit area of the second capacitor Cb using the lower metal layer M1 and the upper metal layer M2 was $9.67 \times 10^{-5}$ pF/$\mu$m$^2$, unit capacitance per unit area of the first capacitor Ca using the lower transparent conductive layer M3 and the upper transparent conductive layer M4 was $4.43 \times 10^{-4}$ pF/$\mu$m$^2$. Results is shown in Table 1.

TABLE 1

|  | Comparative Example | Example 1 | Example 2 | Example 3 |
|---|---|---|---|---|
| M1-M2 overlapping area ($\mu$m$^2$) | 16552.75 | 6238.325 | 8783.75 | 6238.325 |
| M1-M2 capacitance (pF) | 1.6008 | 0.6033 | 0.8495 | 0.6033 |
| M3-M4 overlapping area ($\mu$m$^2$) | 0 | 9839.2 | 4410 | 9839.2 |
| M3-M4 capacitance (pF) | 0 | 4.3559 | 1.9523 | 4.3559 |
| Total capacitance (pF) | 1.6008 | 4.9592 | 2.8018 | 4.9592 |
| Width Wc ($\mu$m) | 159.0 | 103.4 | 48.5 | 0 |
| Reduced width ($\mu$m) of frame region with respect to in Comparative Example | — | 55.6 | 110.5 | 159.0 |

Note that in Example 1, a layout in consideration of light-transmitting in the seal region 230R is used assuming that a position of the seal region 230R in a non-display region is the same as a position in Comparative Example. In Examples 2 and 3, a layout enabling further reduction in a circuit width is used, and according to the layout, a position of the seal region 230R is displaced from the position in Comparative Example.

In Comparative Example, it is necessary to provide the transparent portions each having predetermined area in the electrodes of the capacitance portion CAP(900). The width Wc in the X-direction required to form the capacitance portion CAP(900) is determined by a sum of overlapping area of the electrodes to obtain the predetermined capacitance, and area of the transparent portions. For example, to form the capacitance portion CAP(900) having a capacitance of about 1.6 pF, the width Wc required for the capacitance portion CAP becomes 159 $\mu$m.

In contrast, in the gate driver 301, it is unnecessary to provide the transparent portion in the capacitance portion CAP(1). Thus, even when the width (width of the first capacitor Ca) Wc required for the capacitance portion CAP (1) is reduced to 103.4 $\mu$m, the capacitance portion CAP(1) can have a capacitance of about 5.0 pF. In addition, in the gate driver 303, even when the width Wc required for the capacitance portion CAP(4) is reduced to 48.5 $\mu$m, the capacitance portion CAP(4) can secure a capacitance (total capacitance of the first capacitor Ca and the second capacitor Cb) of about 2.8 pF. Further, the first capacitor Ca is disposed overlapping with other circuit elements as the gate driver 302, and accordingly, it becomes unnecessary to secure the width Wc for forming the capacitance portion CAP (Wc=0). Therefore, while capacitance equivalent to the capacitance of the capacitance portion CAP(1) can be secured, the width Wx of the entire circuit can further be reduced by 103.4 $\mu$m, as compared to in the gate driver GD(1). Thus, it is understood according to the first and second embodiments that the area or the width required for the circuit can further be reduced as compared to in Comparative Example, and narrowing of the non-display region can be achieved.

Third Embodiment

A third embodiment is a display device including an active matrix substrate including a peripheral circuit formed in a monolithic manner, a liquid crystal layer, and a counter substrate. The display device of the present embodiment is different from the embodiments described above in that an upper capacitance electrode of a capacitance portion CAP is provided on the counter substrate instead of the active matrix substrate.

The present embodiment can be suitably applied to a display device of a vertical electric field mode such as a TN mode and a VA mode, for example. In addition, the present embodiment can be applied suitably to a display device of an in-cell touch panel type. In the display device of an in-cell touch panel type, a transparent conductive film formed on the counter substrate may be patterned to form, on the counter substrate, a transparent electrode serving as a common electrode and an electrode for a touch sensor. When the present embodiment is applied to such a display device, the upper capacitance electrode of the capacitance portion CAP can be formed on the counter substrate at the same time at the patterning step of forming the transparent electrode, and thus, the capacitance portion CAP including a first capacitor Ca being transparent can be formed without adding the manufacturing step. Note that a structure and action of a display device of an in-cell touch panel type are disclosed in, for example, JP 2014-109904 A and the like. The entire contents of the disclosure of JP 2014-109904 A are incorporated herein as reference.

Figure 11A:
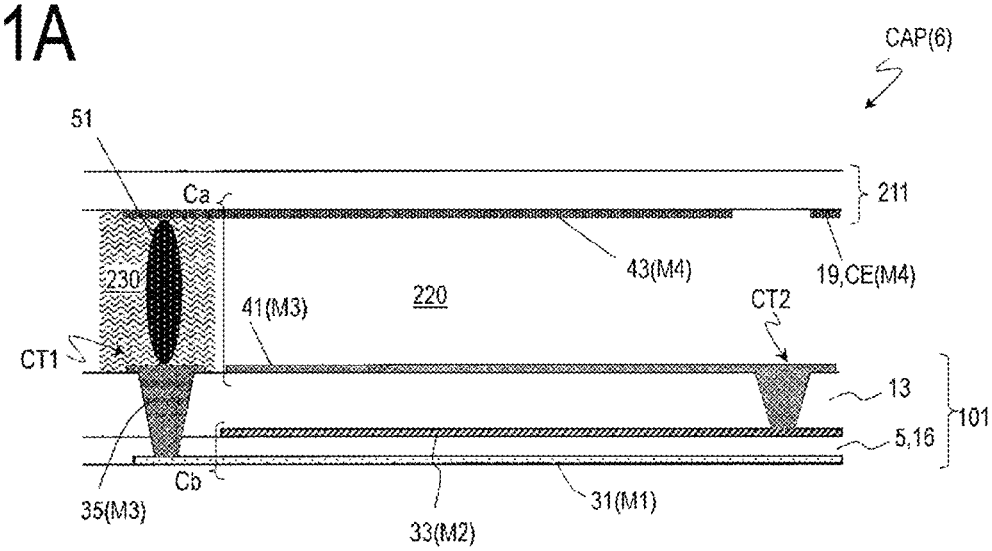
FIGS. 11A and 11B are respectively a cross-sectional view and a schematic view of a capacitance portion CAP(6) of a gate driver in a third embodiment.
Figure 11B:
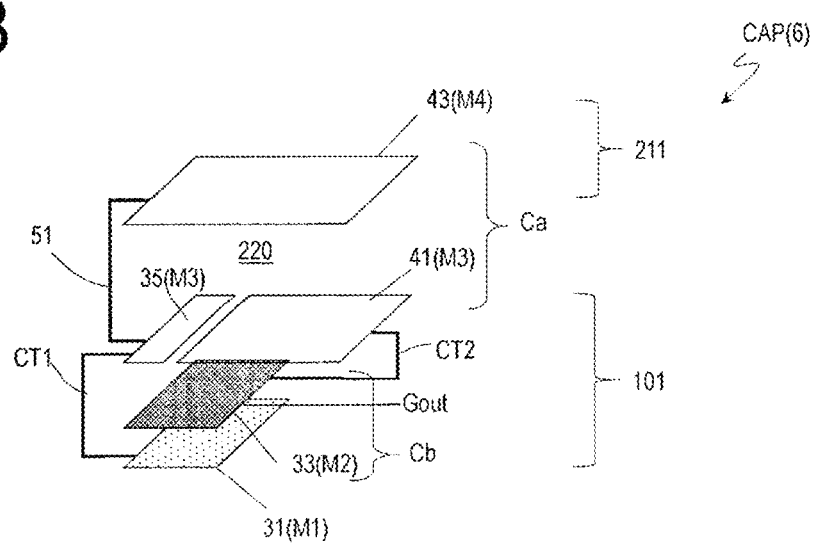

FIG. 11A is a cross-sectional view of a capacitance portion CAP(6) of a gate driver in the present embodiment, and FIG. 11B is a schematic view of the capacitance portion CAP(6).

The display device of the present embodiment includes an active matrix substrate 101, a counter substrate 211, and a liquid crystal layer 220. The liquid crystal layer 220 is disposed between the active matrix substrate 101 and the counter substrate 211. In a periphery of the liquid crystal layer 220, a sealing portion 230 configured to enclose a liquid crystal material is provided. The sealing portion 230 may include conductive particles 51. Alternatively, the sealing portion 230 may be formed of a resin having electrical conductivity.

The active matrix substrate 101 is different from the active matrix substrate 100 described above in that the active matrix substrate 101 includes a lower metal layer M1, an upper metal layer M2, and a lower transparent conductive layer M3, but does not include a dielectric layer 17 and an upper transparent conductive layer M4. In the active matrix substrate 101, the lower transparent conductive layer M3 includes a lower transparent electrode (not illustrated) disposed in a display region and functioning as a pixel electrode PE, and a lower capacitance electrode 41 of the first capacitor Ca disposed in a non-display region. The lower transparent conductive layer M3 may further include a transparent connection portion 35 disposed in the non-display region.

The counter substrate 211 includes a substrate (for example, a glass substrate) (not illustrated), a color filter layer (not illustrated), and an upper transparent conductive layer M4 disposed on the liquid crystal layer side of the substrate. The upper transparent conductive layer M4 includes an upper transparent electrode (not illustrated) disposed in the display region and functioning as a common electrode CE, and an upper capacitance electrode 43 of the first capacitor Ca disposed in the non-display region.

A configuration of the capacitance portion CAP(6) of a gate driver GD in the present embodiment will be described more specifically.

The capacitance portion CAP(6) includes the first capacitor Ca, and a second capacitor Cb connected in parallel to the first capacitor Ca. The capacitance portion CAP(6) is disposed closer to the display region side than the sealing portion 230. Note that at least the first capacitor Ca of the gate driver GD may be disposed closer to the display region side than the sealing portion 230.

The first capacitor Ca includes a lower capacitance electrode (first lower capacitance electrode) 41 formed in the lower transparent conductive layer M3 in the active matrix substrate 101, an upper capacitance electrode (first upper capacitance electrode) 43 formed in the upper transparent conductive layer M4 in the counter substrate 211, and a capacitance insulator positioned between the lower capacitance electrode 41 and the upper capacitance electrode 43. The capacitance insulator includes the liquid crystal layer 220. The lower capacitance electrode 41 and the upper capacitance electrode 43 are disposed to face each other with the liquid crystal layer 220 interposed between the lower capacitance electrode 41 and the upper capacitance electrode 43 in the non-display region.

The second capacitor Cb includes a lower capacitance electrode 31 formed in the lower metal layer M1, and an upper capacitance electrode 33 formed in the upper metal layer M2. The second capacitor Cb includes a configuration similar to the configuration described above with reference to FIGS. 8A to 8C.

One of the lower capacitance electrode 41 and the upper capacitance electrode 43 of the first capacitor Ca is connected to the lower capacitance electrode 31 of the second capacitor Cb in a first contact portion CT1, and is electrically connected to a gate electrode 3B of an output transistor T5 and a node netA via the lower capacitance electrode 31. The other of the lower capacitance electrode 41 and the upper capacitance electrode 43 is connected to the upper capacitance electrode 33 of the second capacitor Cb in a second contact portion CT2, and is electrically connected to a source electrode 8B of the output transistor T5 and a node GOUT via the upper capacitance electrode 33.

In the example illustrated in FIGS. 11A and 11B, the lower capacitance electrode 41 is electrically connected to the transparent connection portion 35 in the first contact portion CT1 via the sealing portion 230. In this example, the sealing portion 230 includes the conductive particles 51 such as Au particles, and the lower capacitance electrode 41 and the transparent connection portion 35 can be connected electrically by these conductive particles 51. The transparent connection portion 35 is formed in the lower transparent conductive layer M3, for example. The transparent connection portion 35 is electrically separated from the lower capacitance electrode 41. The transparent connection portion 35 may be in contact with the lower capacitance electrode 31 in an opening formed in insulating layers (here, an interlayer insulating layer 13, a gate insulating layer 5, and a channel protection layer 16). The lower capacitance electrode 31 is electrically connected to (here, integrally formed with) the gate electrode 3B and the node netA.

The upper capacitance electrode 43 is in contact with the upper capacitance electrode 33 in the opening formed in the interlayer insulating layer 13 in the second contact portion CT2. The upper capacitance electrode 33 is electrically connected to (here, integrally formed with) the source electrode 8B of the output transistor TS and the node GOUT.

Figure 12A:
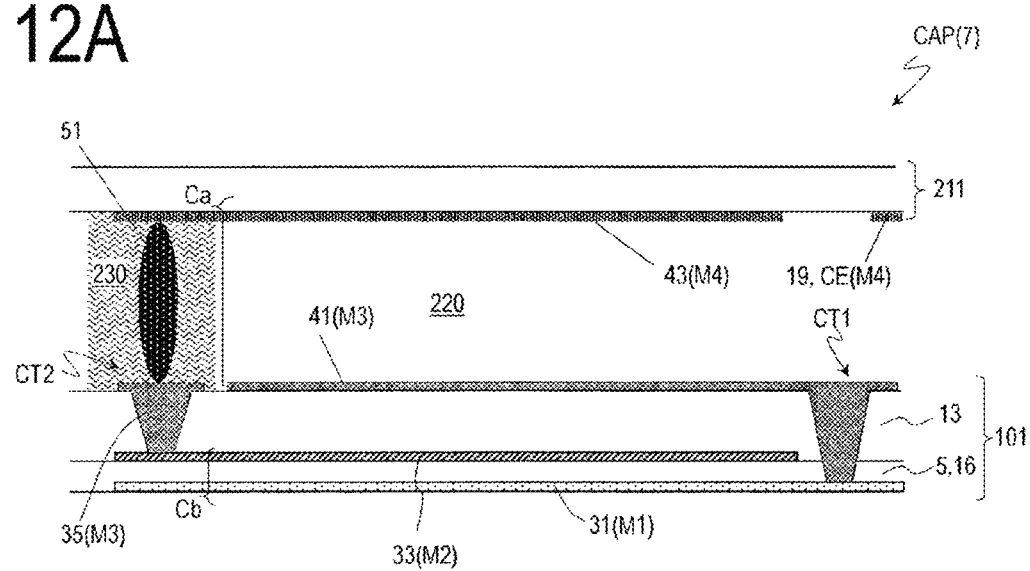
FIGS. 12A and 12B are respectively a cross-sectional view and a schematic view of a capacitance portion CAP(7) of another gate driver in the third embodiment.
Figure 12B:
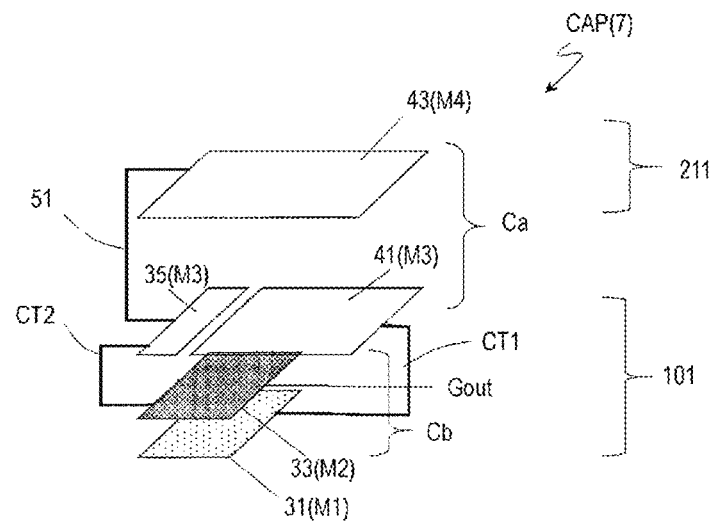

FIG. 12A is a cross-sectional view of a capacitance portion CAP(7) of another gate driver in the present embodiment, and FIG. 12B is a schematic view of the capacitance portion CAP(7).

As illustrated, the lower capacitance electrode 41 may be in contact with the lower capacitance electrode 31 in the opening formed in the interlayer insulating layer 13, the gate insulating layer 5, and the channel protection layer 16 in first contact portion CT1, and may be connected electrically to the node netA and the gate electrode 3B via the lower capacitance electrode 31. The upper capacitance electrode 43 may be in contact with the transparent connection portion 35 via the sealing portion 230 in the second contact portion CT2. The transparent connection portion 35 may be in contact with the upper capacitance electrode 33 in the opening formed in the interlayer insulating layer 13, and may be connected electrically to the source electrode 8B of the output transistor T5 and the node GOUT via the upper capacitance electrode 33.

The first capacitor Ca and the second capacitor Cb may at least partially overlap with each other as viewed from a normal direction of the substrate. Accordingly, area or a width (layout area or a layout width) required for the capacitance portion CAP can further be reduced.

Note that the lower transparent conductive layer M3 includes the pixel electrode, and the upper transparent conductive layer M4 is the transparent conductive layer including the common electrode as described above, but as long as the lower transparent conductive layer M3 and the upper transparent conductive layer M4 are transparent conductive layers formed on the active matrix substrate and the counter substrate, respectively, the lower transparent conductive layer M3 and the upper transparent conductive layer M4 may each be a layer including another transparent electrode.

TFT Structure

The pixel TFT and the circuit TFT (including the output transistor T5) of each of the first to third embodiments described above may be of an etch stop type, or may be of a channel etched type.

Figure 13:
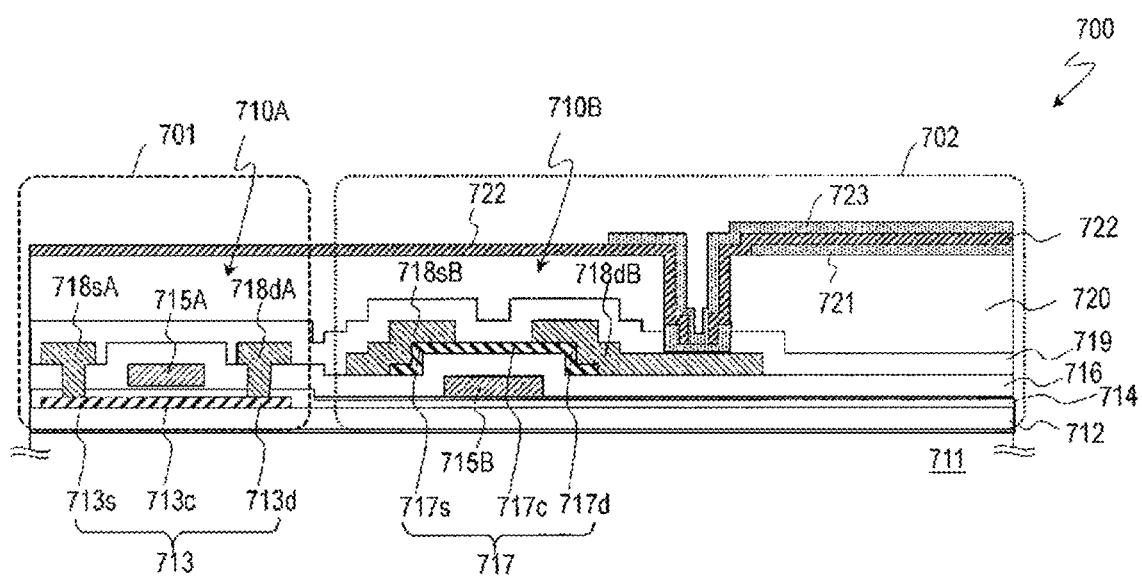
FIG. 13 is a schematic cross-sectional view exemplifying a portion of an active matrix substrate 700 of a fourth embodiment.

In the TFT of a channel etched type, an etch stop layer is not formed on a channel region, and a lower face of an end portion on the channel side of each of source and drain electrodes is disposed to come into contact with an upper face of an oxide semiconductor layer (see a thin film transistor 710B of FIG. 13). The TFT of a channel etched type is formed, for example, by forming a conductive film for source and drain electrodes on the oxide semiconductor layer and performing source and drain separation. At the source and drain separation step, a surface portion of the channel region may be etched.

Meanwhile, in the TFT of an etch stop type, an etch stop layer is formed on a channel region, and a lower face of an end portion on the channel side of each of source and drain electrodes is positioned on the etch stop layer, for example. The TFT of an etch stop type is formed, for example, by forming the etch stop layer covering a portion to be the channel region of the oxide semiconductor layer, then forming the conductive film for source and drain electrodes on the oxide semiconductor layer and the etch stop layer, and performing the source and drain separation.

Oxide Semiconductor

A semiconductor layer of each of a pixel TFT 10 and a circuit TFT (including the output transistor T5) may be a silicon semiconductor layer, or may be an oxide semiconductor layer.

The oxide semiconductor present in the oxide semiconductor layer may be an amorphous oxide semiconductor, or may be a crystalline oxide semiconductor including a crystalline portion. Examples of the crystalline oxide semiconductor include a polycrytalline oxide semiconductor, a microcrystalline oxide semiconductor, and a crystalline oxide semiconductor having a c-axis oriented substantially perpendicular to a layer face.

The oxide semiconductor layer may have a layered structure including two or more layers. In a case where the oxide semiconductor layer includes a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. When the oxide semiconductor layer includes a dual-layer structure including an upper layer and a lower layer, an energy gap of an oxide semiconductor present in the upper layer is preferably greater than an energy gap of an oxide semiconductor present in the lower layer. However, when a difference in the energy gap between these layers is relatively small, the energy gap of the oxide semiconductor in the lower layer may be greater than the energy gap of the oxide semiconductor in the upper layer.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein as reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer can be formed of an oxide semiconductor film including an In—Ga—Zn—O based semiconductor.

The In—Ga—Zn—O based semiconductor may be an amorphous semiconductor, or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein as reference. A TFT including an In—Ga—Zn—O based semiconductor layer has high mobility (more than 20 times as compared to an a-Si TFT) and a low leakage current (less than 1/100th as compared to the a-Si TFT), and thus such a TFT can be used suitably as a driving TFT (for example, a TFT present in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

Fourth Embodiment

Hereinafter, a fourth embodiment of a semiconductor device according to the disclosure will be described with reference to the drawings. The semiconductor device of the present embodiment is an active matrix substrate including an oxide semiconductor TFT and a crystalline silicon TFT formed on the same substrate.

The active matrix substrate includes a TFT (pixel TFT) for each pixel. As the pixel TFT, for example, an oxide semiconductor TFT including an In—Ga—Zn—O based semiconductor film serving as an active layer is used.

A portion of or all of a peripheral drive circuit may also be formed integrally on the same substrate as the pixel TFT. Such an active matrix substrate is called a driver-monolithic active matrix substrate. In the driver-monolithic active matrix substrate, the peripheral drive circuit is provided in a region (a non-display region or a frame region) other than a region (display region) including a plurality of pixels. As a TFT (circuit TFT) constituting the peripheral drive circuit, for example, a crystalline silicon TFT including a polycrystalline silicon film serving as an active layer is used. Thus, when the oxide semiconductor TFT is used as the pixel TFT, and the crystalline silicon TFT is used as the circuit TFT, power consumption can be reduced in the display region, and a frame region can also be reduced.

The pixel TFT 10 illustrated in FIGS. 2A and 2B can be used as the pixel TFT. This point will be described below.

FIG. 13 is a schematic cross-sectional view exemplifying a portion of an active matrix substrate 700 of the present embodiment.

As illustrated in FIG. 13, in the active matrix substrate 700, a second thin film transistor 710B is formed as the pixel TFT in each pixel in a display region DR, and a first thin film transistor 710A is formed as the circuit TFT in a drive circuit formation region in a non-display region FR. As the output transistor T5 of each of the embodiments described above, the first thin film transistor 710A may be used.

The active matrix substrate 700 includes a substrate 711, a foundation film 712 formed on a surface of the substrate 711, the first thin film transistor 710A formed on the foundation film 712, and the second thin film transistor 710B formed on the foundation film 712. The first thin film transistor 710A is a crystalline silicon TFT including an active region including mainly crystalline silicon. The second thin film transistor 710B is an oxide semiconductor TFT including an active region including mainly an oxide semiconductor. The first thin film transistor 710A and the second thin film transistor 710B are formed integrally into the substrate 711. The "active region" here refers to a region in a semiconductor layer serving as an active layer of a TFT, and in the region, a channel is formed.

The first thin film transistor 710A includes a crystalline silicon semiconductor layer (for example, a low-temperature polysilicon layer) 713 formed on the foundation film 712, a first insulating layer 714 covering the crystalline silicon semiconductor layer 713, and a gate electrode 715A provided on the first insulating layer 714. The first insulating layer 714 includes a portion positioned between the crystalline silicon semiconductor layer 713 and the gate electrode 715A, and functioning as a gate insulating film of the first thin film transistor 710A. The crystalline silicon semiconductor layer 713 includes a region (active region) 713c where a channel is formed, and a source region 713s and a drain region 713d positioned on both the sides of the active region, respectively. In this example, in the crystalline silicon semiconductor layer 713, a portion overlapping with the gate electrode 715A via the first insulating layer 714 serves as the active region 713c. In addition, the first thin film transistor 710A includes a source electrode 718sA and a drain electrode 718dA connected to the source region 713s and the drain region 713d, respectively. The source electrode 718sA and the drain electrode 718dA may be provided on an interlayer insulating film (here, a second insulating layer 716) covering the gate electrode 715A and the crystalline silicon semiconductor layer 713, and may each be connected to the crystalline silicon semiconductor layer 713 in a contact hole formed in the interlayer insulating film.

The second thin film transistor 710B includes a gate electrode 715B provided on the foundation film 712, the second insulating layer 716 covering the gate electrode 715B, and an oxide semiconductor layer 717 disposed on the second insulating layer 716. As illustrated, the first insulating layer 714 serving as a gate insulating film of the first thin film transistor 710A may extend to a region where the second thin film transistor 710B is to be formed. In this case, the oxide semiconductor layer 717 may be formed on the first insulating layer 714. The second insulating layer 716 includes a portion positioned between the gate electrode 715B and the oxide semiconductor layer 717, and functioning as a gate insulating film of the second thin film transistor 710B. The oxide semiconductor layer 717 includes a region (active region) 717c where a channel is formed, and a source contact region 717s and a drain contact region 717d positioned on both the sides of the active region, respectively. In this example, in the oxide semiconductor layer 717, a portion overlapping with the gate electrode 715B via the second insulating layer 716 serves as the active region 717c. In addition, the second thin film transistor 710B further includes a source electrode 718sB and a drain electrode 718dB connected to the source contact region 717s and the drain contact region 717d, respectively. Note that a configuration where the foundation film 712 is not provided on the substrate 711 can be used.

The thin film transistors 710A and 710B are covered with a passivation film 719 and a flattering film 720. In the second thin film transistor 710B functioning as the pixel TFT, the gate electrode 715B is connected to a gate bus line (not illustrated), the source electrode 718sB is connected to a source bus line (not illustrated), and the drain electrode 718dB is connected to a pixel electrode 723. In this example, the drain electrode 718dB is connected to the corresponding pixel electrode 723 in an opening formed in the passivation film 719 and the flattering film 720. A video signal is supplied to the source electrode 718sB via the source bus line, and a necessary electric charge is written to the pixel electrode 723 on the basis of a gate signal from the gate bus line.

Note that as illustrated, a transparent conductive layer 721 may be formed on the flattering film 720 as a common electrode, and a third insulating layer 722 may be formed between the transparent conductive layer (common electrode) 721 and the pixel electrode 723. In this case, the pixel electrode 723 may be provided with an opening having a shape of a slit. Such an active matrix substrate 700 can be applied to a display device of an FFS mode, for example.

As the second thin film transistor 710B of the present embodiment, the pixel TFT 10 of each of the embodiments described above can be used. When the pixel TFT 10 is applied, the gate electrode 3A, the gate insulating layer 5, the oxide semiconductor layer 7A, the source electrode 8A, and the drain electrode 9A in the pixel TFT 10 may correspond to the gate electrode 715B, the second insulating layer (gate insulating layer) 716, the oxide semiconductor layer 717, the source electrode 718sB, and the drain electrode 718dB illustrated in FIG. 13, respectively.

In addition, an inspection circuit may be integrally formed in the non-display region. As a TFT (inspection TFT) constituting the inspection circuit, the thin film transistor 710B being an oxide semiconductor TFT may be used. Note that the inspection TFT and the inspection circuit may be formed in a region where a semiconductor chip is mounted, for example.

In the example illustrated, the first thin film transistor 710A includes a top gate structure in which the crystalline silicon semiconductor layer 713 is disposed between the gate electrode 715A and the substrate 711 (foundation film 712). Meanwhile, the second thin film transistor 710B includes a bottom gate structure in which the gate electrode 715B is disposed between the oxide semiconductor layer 717 and the substrate 711 (foundation film 712). Such structures are used, and accordingly, an increase in the number of manufacturing steps and manufacturing costs can be suppressed more effectively when two kinds of thin film transistors such as the thin film transistors 710A and 710B are integrally formed on the same substrate 711.

A TFT structure of each of the first thin film transistor 710A and the second thin film transistor 710B is not limited to the above. For example, the thin film transistors 710A and 710B each may include the same TFT structure. Alternatively, the first thin film transistor 710A may include a bottom gate structure, and the second thin film transistor 710B may include a top gate structure. In addition, in the case of the bottom gate structure, the TFT structure may be of a channel etched type like the thin film transistor 710B, or may be of an etch stop type. In addition, the TFT structure may be of a bottom contact type in which a source electrode and a drain electrode are positioned below a semiconductor layer.

The second insulating layer 716 being a gate insulating film of the second thin film transistor 710B may extend to a region in which the first thin film transistor 710A is formed, and may function as an interlayer insulating film covering the gate electrode 715A and the crystalline silicon semiconductor layer 713 of the first thin film transistor 710A. Thus, when the interlayer insulating film of the first thin film transistor 710A and the gate insulating film of the second thin film transistor 710B are formed in the same layer (second insulating layer) 716, the second insulating layer 716 may include a layered structure. For example, the second insulating layer 716 may include a layered structure including a hydrogen donor layer (for example, a silicon nitride layer) capable of supplying hydrogen, and an oxygen donor layer (for example, a silicon oxide layer) disposed on the hydrogen donor layer and being capable of supplying oxygen.

The gate electrode 715A of the first thin film transistor 710A and the gate electrode 715B of the second thin film transistor 710B may be formed in the same layer. In addition, the source electrode 718sA and the drain electrode 718dA of the first thin film transistor 710A, and the source electrode 718sB and the drain electrode 718dB of the second thin film transistor 710B may be formed in the same layer. The "formed in the same layer," means being formed by using the same film (conductive film). Accordingly, an increase in the number of manufacturing steps and manufacturing costs can be suppressed.

INDUSTRIAL APPLICABILITY

Each of the embodiments of the disclosure can be applied suitably to a monolithic gate driver in an active matrix substrate. Such an active matrix substrate can be applied to various electronic devices such as a display device such as a liquid crystal display device, an organic electroluminescence (EL) display device, and an inorganic electroluminescence display device, an imaging device such as an image sensor, an image input device, a fingerprint reader, and a semiconductor memory.

REFERENCE SIGNS LIST

1 Substrate
3A, 3B Gate electrode
5 Gate insulating layer
7A, 7B Oxide semiconductor layer
8A, 8B Source electrode
9A, 9B Drain electrode
10 Pixel TFT
11 Inorganic insulating layer
12 Organic insulating layer
13 Interlayer insulating layer
15 Lower transparent electrode
CH1 Opening
16 Channel protection layer
17 Dielectric layer
19 Upper transparent electrode
21, 31, 41 Lower capacitance electrode
23, 33, 43 Upper capacitance electrode
25 Upper metal connection portion
26 Lower metal connection portion
28 Shield layer
31p, 33p Opening
35 Transparent connection portion
51 Conductive particles
100, 101 Active matrix substrate
200 Liquid crystal display device (LCD panel)
210, 211 Counter substrate
220 Liquid crystal layer
230 Sealing portion
230R Seal region
CAP, CAP(1) to CAP(7) Capacitance portion
T1 to T5 N-channel type thin film transistor
Ca First capacitor
Cb Second capacitor
M1 Lower metal layer
M2 Upper metal layer
M3 Lower transparent conductive layer
M4 Upper transparent conductive layer
DR Display region
FR Non-display region
GD Gate driver
SD Source driver
P Pixel region
CE Common electrode
PE Pixel electrode
GL Gate bus line
SL Source bus line

The invention claimed is:

1. An active matrix substrate comprising:
a display region including a plurality of pixels, and a non-display region provided in a periphery of the display region;
a substrate;
a peripheral circuit supported by the substrate, disposed in the non-display region, and including a first TFT and a capacitance portion; and
a lower transparent electrode disposed in each of the plurality of pixels, and an upper transparent electrode disposed on the lower transparent electrode via a dielectric layer in the display region,
wherein the active matrix substrate includes:
a gate metal layer including a gate electrode of the first TFT,
a source metal layer including a source electrode of the first TFT,
a lower transparent conductive layer positioned above the gate metal layer and the source metal layer and including the lower transparent electrode, and
an upper transparent conductive layer positioned above the lower transparent conductive layer and including the upper transparent electrode,
the capacitance portion includes a first capacitor including a first lower capacitance electrode formed in the lower transparent conductive layer, a first upper capacitance electrode formed in the upper transparent conductive layer, and a portion positioned between the first lower capacitance electrode and the first upper capacitance electrode in the dielectric layer,
the capacitance portion further includes a second capacitor connected in parallel to the first capacitor and disposed on the substrate side of the first capacitor, and
the second capacitor includes a second lower capacitance electrode, and a second upper capacitance electrode disposed on the second lower capacitance electrode via an insulator, and one of the second lower capacitance electrode and the second upper capacitance electrode is formed in the gate metal layer, and the other is formed in the source metal layer.

2. The active matrix substrate according to claim 1, wherein one of the lower transparent electrode and the upper transparent electrode is a pixel electrode, and the other is a common electrode.

3. The active matrix substrate according to claim 1, wherein the first capacitor and the second capacitor at least partially overlap with each other as viewed from a normal direction of the substrate.

4. The active matrix substrate according to claim 1, wherein the second lower capacitance electrode and the second upper capacitance electrode each include a cut-out portion and/or an opening, and the cut-out portion and/or the opening of the second lower capacitance electrode and the cut-out portion and/or the opening of the second upper capacitance electrode are disposed to face each other.

5. The active matrix substrate according to claim 1, wherein one of the first lower capacitance electrode and the first upper capacitance electrode of the capacitance portion is electrically connected to the gate electrode of the first TFT, and the other is electrically connected to the source electrode of the first TFT.

6. The active matrix substrate according to claim 5, wherein
the peripheral circuit is a gate driver including a shift register including a plurality of unit circuits, and
each of the plurality of unit circuits includes the first TFT and the capacitance portion, the first TFT is an output transistor, and the capacitance portion is a bootstrap capacitance portion.

7. The active matrix substrate according to claim 1, further comprising:
a second TFT disposed in each of the plurality of pixels, wherein the second TFT is an oxide semiconductor TFT including an oxide semiconductor layer.

8. The active matrix substrate according to claim 7, wherein the oxide semiconductor layer includes an In—Ga—Zn—O based semiconductor.

9. The active matrix substrate according to claim 8, wherein the In-Ga-Zn-O based semiconductor includes a crystalline portion.

10. The active matrix substrate according to claim 7, wherein the second TFT is a channel etched type TFT.

11. The active matrix substrate according to claim 7, wherein the second TFT is an etch stop type TFT.

12. A display device comprising:
the active matrix substrate according to claim 1;
a counter substrate disposed to face the active matrix substrate;
a liquid crystal layer provided between the active matrix substrate and the counter substrate; and
a sealing portion formed of a sealing member including a photocurable resin, and surrounding the liquid crystal layer,
wherein at least a portion of the first capacitor overlaps with the sealing portion as viewed from a normal direction of the substrate.

13. A display device comprising:
an active matrix substrate including
a display region including a plurality of pixels, and a non-display region provided in a periphery of the display region,
a substrate, a peripheral circuit supported by the substrate, disposed in the non-display region, and including a first TFT and a capacitance portion, and a pixel electrode disposed in each of the plurality of pixels in the display region;
a counter substrate disposed to face the active matrix substrate; and
a liquid crystal layer provided between the active matrix substrate and the counter substrate,
wherein the active matrix substrate includes
a gate metal layer including a gate electrode of the first TFT,
a source metal layer including a source electrode of the first TFT, and
a lower transparent conductive layer positioned above the gate metal layer and the source metal layer and including the pixel electrode,
the counter substrate includes an upper transparent conductive layer including a common electrode disposed to face the pixel electrode,
the capacitance portion includes a first capacitor, and a second capacitor connected in parallel to the first capacitor and disposed on the substrate side of the first capacitor, and the first capacitor and the second capacitor at least partially overlap with each other as viewed from a normal direction of the substrate,
the first capacitor includes
a first lower capacitance electrode formed in the lower transparent conductive layer,
a first upper capacitance electrode formed in the upper transparent conductive layer, and
a portion positioned between the first lower capacitance electrode and the first upper capacitance electrode in the liquid crystal layer, and
the second capacitor includes a second lower capacitance electrode, and a second upper capacitance electrode disposed on the second lower capacitance electrode via an insulator, and one of the second lower capacitance electrode and the second upper capacitance electrode is formed in the gate metal layer, and the other is formed in the source metal layer.

14. The display device according to claim 13, further comprising:
a sealing portion surrounding the liquid crystal layer,
wherein the sealing portion has electrical conductivity, or includes particles having electrical conductivity,
the lower transparent conductive layer further includes a transparent connection portion disposed in the non-display region and electrically separated from the first upper capacitance electrode, and
the first lower capacitance electrode is electrically connected to the second lower capacitance electrode or the second upper capacitance electrode of the second capacitor via the sealing portion and the transparent connection portion.

15. The display device according to claim 13, further comprising:
a second TFT disposed in each of the plurality of pixels, wherein the second TFT is an oxide semiconductor TFT including an oxide semiconductor layer.

16. The display device according to claim 15, wherein the oxide semiconductor layer includes an In—Ga—Zn—O based semiconductor.

17. The display device according to claim 16, wherein the In—Ga—Zn—O based semiconductor includes a crystalline portion.

18. The display device according to claim 15, wherein the second TFT is a channel etched type TFT.

19. The display device according to claim 15, wherein the second TFT is an etch stop type TFT.

* * * * *